US012677536B2

(12) United States Patent
Yang et al.

(10) Patent No.: US 12,677,536 B2
(45) Date of Patent: Jul. 7, 2026

(54) METHOD OF MANUFACTURING DISPLAY APPARATUS

(71) Applicant: Samsung Display Co., LTD., Yongin-si (KR)

(72) Inventors: Sukyoung Yang, Yongin-si (KR); Joonyong Park, Yongin-si (KR); Hyuneok Shin, Yongin-si (KR); Dongmin Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 374 days.

(21) Appl. No.: 18/401,790

(22) Filed: Jan. 2, 2024

(65) Prior Publication Data

US 2024/0324280 A1     Sep. 26, 2024

(30) Foreign Application Priority Data

Mar. 24, 2023     (KR) ........................ 10-2023-0039228
Mar. 31, 2023     (KR) ........................ 10-2023-0042858

(51) Int. Cl.
H10K 59/12          (2023.01)
H10K 59/122        (2023.01)
(52) U.S. Cl.
CPC ....... H10K 59/1201 (2023.02); H10K 59/122 (2023.02)
(58) Field of Classification Search
CPC ............. H10K 59/1201; H10K 59/122; H10K 59/124; H10K 59/131
See application file for complete search history.

(56) References Cited

U.S. PATENT DOCUMENTS

| | | | |
|---|---|---|---|
| 9,337,244 B2 | 5/2016 | Hatano et al. | |
| 11,348,983 B1* | 5/2022 | Choung | ........... H10K 59/80522 |
| 11,552,143 B1* | 1/2023 | Choung | .............. H10K 59/173 |
| 2016/0351846 A1* | 12/2016 | Kim | ..................... H10K 59/121 |

(Continued)

FOREIGN PATENT DOCUMENTS

| | | |
|---|---|---|
| CN | 112331810 A | 2/2021 |
| KR | 100714012 B1 | 5/2007 |
| KR | 102010429 B1 | 8/2019 |

*Primary Examiner* — Douglas W Owens
(74) *Attorney, Agent, or Firm* — CANTOR COLBURN LLP

(57) ABSTRACT

A method of manufacturing a display apparatus includes: forming a subpixel electrode; forming a conductive bank layer including a first opening overlapping the subpixel electrode, disposed over the subpixel electrode; forming an insulating layer between a peripheral portion of the subpixel electrode and the conductive bank layer and including an opening overlapping the first opening; forming an intermediate layer overlapping the subpixel electrode; forming an opposite electrode overlapping the subpixel electrode; continuously arranging an inorganic passivation layer-forming material on the opposite electrode and the conductive bank layer; forming, on a portion of the inorganic passivation layer-forming material, a first metal layer and a second metal layer, which overlap the first opening; and forming an inorganic passivation layer by etching a portion of the inorganic passivation layer-forming material, which does not overlap the first metal layer and the second metal layer, by using the first and second metal layers as masks.

20 Claims, 19 Drawing Sheets

(56)     References Cited

U.S. PATENT DOCUMENTS

| | | | |
|---|---|---|---|
| 2024/0107817 A1* | 3/2024 | Lee | H10K 59/88 |
| 2024/0276780 A1* | 8/2024 | Shin | H10K 59/1201 |
| 2024/0306433 A1* | 9/2024 | Shin | H10K 59/122 |

* cited by examiner

METHOD OF MANUFACTURING DISPLAY APPARATUS

This application claims priority to Korean Patent Application Nos. 10-2023-0039228, filed on Mar. 24, 2023, and Korean Patent Application No. 10-2023-0042858, filed on Mar. 31, 2023, and all the benefits accruing therefrom under 35 U.S.C. § 119, the contents of which in their entirety are herein incorporated by reference.

BACKGROUND

1. Field

One or more embodiments relate to a method of manufacturing a display apparatus.

2. Description of the Related Art

A display apparatus visually displays data. The display apparatus may provide an image by using light-emitting diodes. Applications of the display apparatus have diversified, and various designs for improving the quality of the display apparatus has been attempted.

SUMMARY

One or more embodiments include a method of manufacturing a display apparatus.

Additional aspects will be set forth in part in the description which follows and, in part, will be apparent from the description, or may be learned by practice of the presented embodiments of the disclosure.

According to one or more embodiments, a method of manufacturing a display apparatus includes: forming a first subpixel electrode; forming a conductive bank layer defining a first opening therein overlapping the first subpixel electrode in a plan view, disposed over the first subpixel electrode, and including a first conductive layer and a second conductive layer; forming an insulating layer arranged between a peripheral portion of the first subpixel electrode and the conductive bank layer and defining an opening therein overlapping the first opening in the plan view; forming a first intermediate layer overlapping the first subpixel electrode via the first opening of the conductive bank layer in the plan view; forming a first opposite electrode overlapping the first subpixel electrode via the first opening of the conductive bank layer in the plan view; continuously arranging a first inorganic passivation layer-forming material on the first opposite electrode and the conductive bank layer; forming, on at least a portion of the first inorganic passivation layer-forming material, a first metal layer and a second metal layer, which overlap the first opening of the conductive bank layer in the plan view; and forming a first inorganic passivation layer by etching a portion of the first inorganic passivation layer-forming material, which does not overlap the first metal layer and the second metal layer in the plan view, by using the first metal layer and the second metal layer as masks.

According to an embodiment, an etch rate of the first conductive layer-forming material may be greater than an etch rate of the second conductive layer-forming material.

According to an embodiment, the first conductive layer-forming material may include a titanium (Ti)-copper (Cu) alloy.

According to an embodiment, the second conductive layer-forming material may include titanium (Ti).

According to an embodiment, the second conductive layer of the conductive bank layer may be disposed on an upper surface of the first conductive layer, and the second conductive layer may include a tip protruding toward the first opening from an inner side surface of the first conducive layer.

According to an embodiment, the first inorganic passivation layer may extend to cover an upper surface and a side surface of the conductive bank layer and an upper surface of the first opposite electrode.

According to an embodiment, the first inorganic passivation layer may include a first portion overlapping the opening of the insulating layer in the plan view, a second portion overlapping an upper surface of the tip of the second conductive layer in the plan view, a third portion overlapping a bottom surface of the tip of the second conductive layer in the plan view, and a fourth portion between the second portion and the third portion.

According to an embodiment, the fourth portion may include a rounded surface in a cross-section.

According to an embodiment, the first inorganic passivation layer may further include a fifth portion between the first portion and the third portion, and at least a portion of the fifth portion may overlap at least a portion of the second portion in the plan view.

According to an embodiment, a cavity between the second portion and the fifth portion may be further defined, and the cavity may be disposed under the tip.

According to an embodiment, the forming of the insulating layer arranged between the peripheral portion of the first subpixel electrode and the conductive bank layer and defining the opening therein overlapping the first opening in the plan view may include: arranging an insulating layer-forming material on the first subpixel electrode, and forming the insulating layer, which defines the opening therein overlapping the first opening in the plan view, by etching at least a portion of the insulating layer-forming material.

According to an embodiment, the forming of, on the at least a portion of the first inorganic passivation layer-forming material, the first metal layer and the second metal layer, which overlap the first opening of the conductive bank layer in the plan view may include: arranging a first metal layer-forming material on the first inorganic passivation layer-forming material, arranging a second metal layer-forming material on the first metal layer-forming material, arranging, on at least a portion of the second metal layer-forming material, a second photoresist overlapping the first opening of the conductive bank layer, and forming the second metal layer by etching a portion of the second metal layer-forming material, which does not overlap the second photoresist, and forming the first metal layer by etching a portion of the first metal layer-forming material, which does not overlap the second photoresist.

According to an embodiment, the first metal layer may continuously extend to be in contact with an upper surface of the first inorganic passivation layer.

According to an embodiment, the first metal layer may continuously extend to be in contact with the rounded surface of the fourth portion of the first inorganic passivation layer.

According to an embodiment, the first metal layer may continuously extend to be in contact with the upper surface of the first inorganic passivation layer constituting the cavity disposed under the tip of the second conductive layer.

According to an embodiment, the second metal layer may be arranged to overlap an upper surface of the first metal layer in the plan view.

According to an embodiment, the first metal layer may include aluminum (Al).

According to an embodiment, the second metal layer may include indium gallium zinc oxide ("IGZO").

According to an embodiment, a thickness of the first metal layer may be about 500 angstroms (Å) to about 1,000 Å, and a thickness of the second metal layer may be about 1,000 Å to about 2,000 Å.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
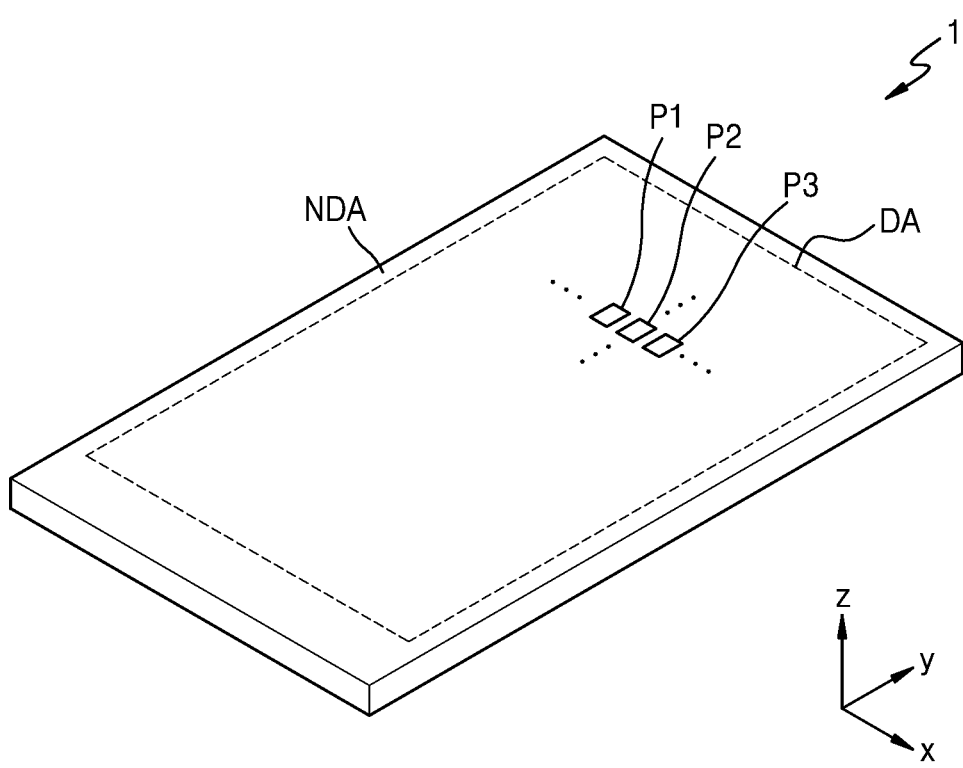
FIG. 1 is a schematic perspective view of a display apparatus according to an embodiment.

Reference will now be made in detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects of the present description. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." Throughout the disclosure, the expression "at least one of a, b or c" indicates only a, only b, only c, both a and b, both a and c, both b and c, all of a, b, and c, or variations thereof.

The disclosure may be modified in various ways and take on various alternative forms, and specific embodiments thereof are shown in the drawings and described in detail below as examples. The effect and features of the present embodiments, and a method to achieve the same, will be clearer referring to the detailed descriptions below with the drawings. However, the disclosure may be implemented in various forms, not by being limited to the embodiments presented below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value. Hereinafter, embodiments of the disclosure will be described in detail with reference to the accompanying drawings, and in the description with reference to the drawings, the same or corresponding components are indicated by the same reference numerals and redundant descriptions thereof are omitted.

In the following embodiment, it will be understood that although the terms "first," "second," etc. may be used herein to describe various components, these components should not be limited by these terms. These terms are only used to distinguish one component from another.

In the following embodiment, the expression of singularity in the present specification includes the expression of plurality unless clearly specified otherwise in context.

In the following embodiment, it will be further understood that the terms "comprises" and/or "comprising" used herein specify the presence of stated features or components, but do not preclude the presence or addition of one or more other features or components.

In the following embodiment, it will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated or reduced for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the present specification, the expression "A and/or B" represents A, B, or A and B. In addition, the expression "at least one of A and B" represents A, B, or A and B.

In the following embodiment, it will be understood that when a layer, region, or component is connected to another layer, region, or component, the layers, regions or components may be directly connected, or/and may be indirectly connected via another layer, region, or component therebetween. For example, in the present specification, when a layer, region, or component is electrically connected to another layer, region, or component, the layers, regions, or components may not only be directly electrically connected, but may also be indirectly electrically connected via another layer, region, or component therebetween.

The x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic perspective view of a display apparatus 1 according to an embodiment.

Referring to FIG. 1, the display apparatus 1 may include a display region DA and a non-display region NDA located outside of the display region DA. The display region DA may display an image via a first subpixel P1, a second subpixel P2, and a third subpixel P3, which are arranged in the display region DA. The non-display region NDA is arranged outside of the display region DA and is where an image is not displayed, and may entirely surround the display region DA. A driver configured to provide an electrical signal or power to the display region DA may be arranged in the non-display region NDA. A pad that is an area to which electronic devices, printed circuit boards, and the like may be electrically connected may be arranged in the non-display region NDA.

In an embodiment, FIG. 1 illustrates that the display region DA has a polygonal shape (for example, quadrangular shape) in which the length in an x direction is smaller than the length in a y direction, but in another embodiment, the display region DA of the display apparatus 1 may have a polygonal shape (for example, quadrangular shape) in which the length in the y direction is smaller than the length in the x direction. FIG. 1 illustrates that the display region DA has a substantially quadrangular shape, but the disclosure is not limited thereto. In another embodiment, the display region DA may have various shapes such as a polygon with N sides (N is a natural number of 3 or more), a circle, or an ellipse. FIG. 1 illustrates that a corner portion of the display region DA has a shape including a vertex where two straight lines meet, but in another embodiment, the display region DA may have a polygonal shape with rounded corner portions.

The display apparatus 1 may be used in various products such as televisions, laptops, monitors, billboards, or Internet of Things ("IOTs") as well as portable electronic devices such as mobile phones, smart phones, tablet personal computers (tablet PCs), mobile communication terminals, electronic notebooks, e-books, portable multimedia players ("PMPs"), navigations, or ultra-mobile PCs ("UMPCs"). In addition, the display apparatus 1 according to an embodiment may be used in wearable devices such as smart watches, watch phones, glass-type displays, and head mounted displays ("HMDs"). In addition, the display apparatus 1 according to an embodiment may be used as a vehicle's dash board, a center information display ("CID") located at a vehicle's center fascia or dashboard, a room mirror display covering for a vehicle's side-view mirror, or a display screen, which is located at the back of a front seat, as entertainment for a passenger in a back seat of a vehicle.

Figure 2:
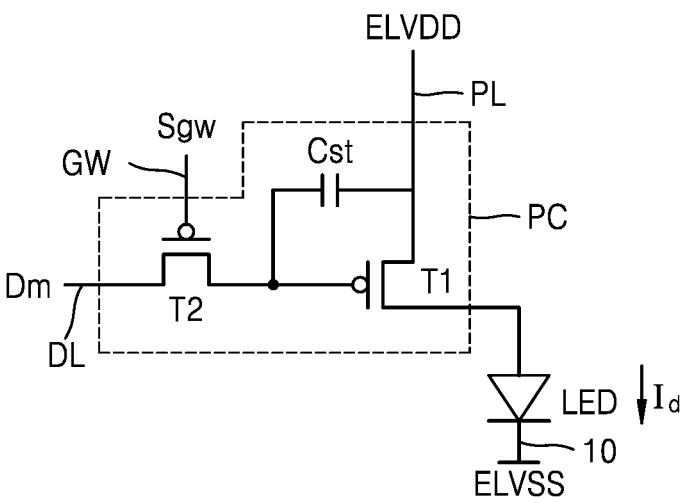
FIG. 2 is a schematic equivalent circuit diagram of a light-emitting diode corresponding to each of a first subpixel, a second subpixel, and a third subpixel, and a subpixel circuit electrically connected to the light-emitting diode, of a display apparatus according to an embodiment.

FIG. 2 is a schematic equivalent circuit diagram of a light-emitting diode corresponding to each of a first subpixel, a second subpixel, and a third subpixel, and a subpixel circuit electrically connected to the light-emitting diode, of a display apparatus according to an embodiment.

Referring to FIG. 2, a light-emitting diode LED may be electrically connected to a subpixel circuit PC, and the subpixel circuit PC may include a first transistor T1, a second transistor T2, and a storage capacitor Cst. A subpixel electrode (for example, anode) of the light-emitting diode LED may be electrically connected to the first transistor T1, and an opposite electrode (for example, cathode) may be electrically connected to a common voltage supply line 10 and may receive a voltage corresponding to a common voltage ELVSS.

The second transistor T2 is configured to transmit, to the first transistor T1, a data signal Dm input via a data line DL according to a scan signal Sgw input via a scan line GW.

The storage capacitor Cst is connected to the second transistor T2 and a driving voltage line PL, and may store a voltage corresponding to a difference between a voltage received from the second transistor T2 and a driving voltage ELVDD supplied to the driving voltage line PL.

The first transistor T1 is connected to the driving voltage line PL and the storage capacitor Cst, and may be configured to control a driving current Id flowing from the driving voltage line PL to the light-emitting diode LED, according to a voltage value stored in the storage capacitor Cst. The light-emitting diode LED may emit light having a certain luminance by the driving current Id.

FIG. 2 illustrates a case where the subpixel circuit PC includes two transistors and one storage capacitor, but the disclosure is not limited thereto. The subpixel circuit PC of a display apparatus according to another embodiment may include at least three transistors and at least two capacitors.

FIGS. 3 to 18 are schematic cross-sectional views of a method of manufacturing a display apparatus, according to an embodiment. As used herein, the "cross-sectional view" is a view of the display apparatus cut by a plane perpendicular to the main surface of the substrate 100.

A method of manufacturing the display apparatus 1 may include: forming a first subpixel electrode 1210 (see FIG. 3); forming a conductive bank layer 300 (see FIG. 7) defining a first opening 300OP1 (see FIG. 7) therein overlapping the first subpixel electrode 1210 (see FIG. 7), disposed over the first subpixel electrode 1210 (see FIG. 7), and including a first conductive layer 310 (see FIG. 7) and a second conductive layer 320 (see FIG. 7); forming an insulating layer 115 (see FIG. 8) arranged between a peripheral portion of the first subpixel electrode 1210 (see FIG. 8) and the conductive bank layer 300 (see FIG. 8) and defining an opening 115OP therein (see FIG. 8) overlapping the first opening 300OP1 (see FIG. 8); forming a first intermediate layer 1220 (see FIG. 10) overlapping the first subpixel electrode 1210 (see FIG. 10) via the first opening 300OP1 (see FIG. 10) of the conductive bank layer 300 (see FIG. 10); forming a first opposite electrode 1230 (see FIG. 10) overlapping the first subpixel electrode 1210 (see FIG. 10) via the first opening 300OP1 (see FIG. 10) of the conductive bank layer 300 (see FIG. 10); continuously arranging a first inorganic passivation layer-forming material 1510s (see FIG. 10) on the first opposite electrode 1230 (see FIG. 10) and the conductive bank layer 300 (see FIG. 10); forming, on at least a portion of the first inorganic passivation layer-forming material 1510s (see FIG. 14), a first metal layer 1610 (see FIG. 14) and a second metal layer 1620 (see FIG. 14), which overlap the first opening 300OP1 (see FIG. 14) of the conductive bank layer 300 (see FIG. 14); and forming a first inorganic passivation layer 1510 (see FIG. 15) by etching a portion of the first inorganic passivation layer-forming material 1510s (see FIG. 14), which does not overlap the first metal layer 1610 (see FIG. 14) and the second metal layer 1620 (see FIG. 14), by using the first metal layer 1610 (see FIG. 14) and the second metal layer 1620 (see FIG. 14) as masks. In the following description, a method of manufacturing the display apparatus 1 is described in more detail.

Figure 3:
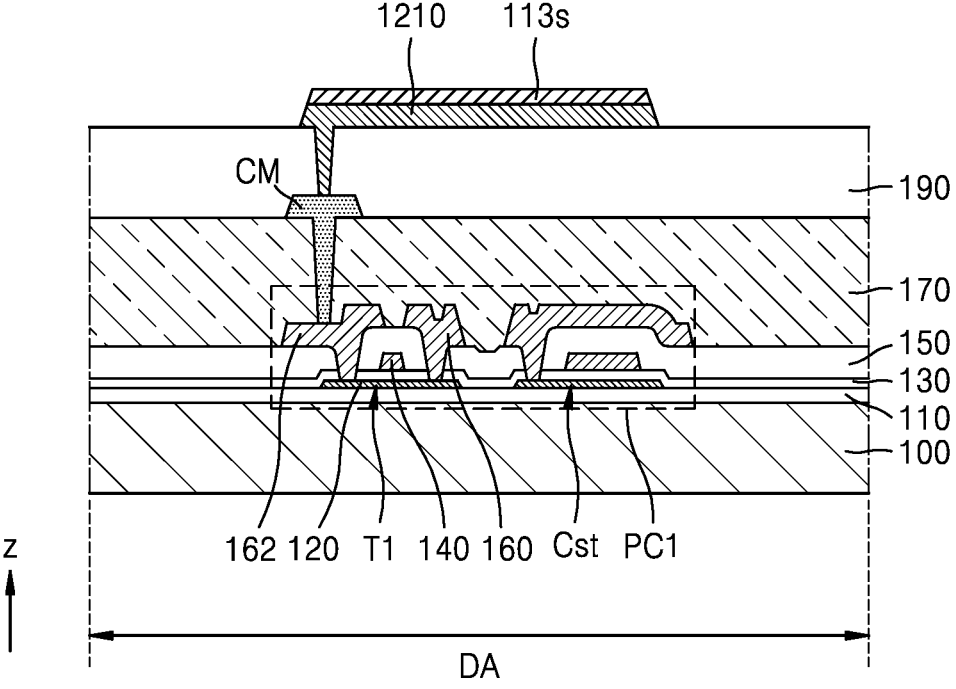
FIGS. 3 to 18 are schematic cross-sectional views of a method of manufacturing a display apparatus, according to an embodiment.

Referring to FIG. 3, in the display region DA of the display apparatus 1, a first subpixel circuit PC1 and the first subpixel electrode 1210 may be disposed on a substrate 100. A conductive passivation layer-forming material 113s may be disposed on an upper surface of the first subpixel electrode 1210.

The substrate 100 may include a glass material or polymer resin. The substrate 100 may include a structure of a stack of a base layer including polymer resin and an inorganic barrier layer. Polymer resin may be polyethersulfone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide ("PI"), polycarbonate, cellulose triacetate ("TAC"), or cellulose acetate propionate ("CAP").

In an embodiment, the first subpixel circuit PC1 may be disposed on the substrate 100. The first subpixel circuit PC1 may include a transistor and a storage capacitor as described above with reference to FIG. 2. In an embodiment, FIG. 3 illustrates the first transistor T1 and the storage capacitor Cst of the first subpixel circuit PC1.

A buffer layer 110 may be arranged between the substrate 100 and the first transistor T1. The buffer layer 110 may prevent penetration of impurities into a semiconductor layer of a transistor. The buffer layer 110 may include an inorganic insulating material such as silicon nitride, silicon oxynitride, and silicon oxide and may be a single layer or a multilayer, which includes the above-described inorganic insulating material.

The first transistor T1 may include a first semiconductor layer 120 on the buffer layer 110 and a first gate electrode 140 overlapping a channel region of the first semiconductor layer 120. The first semiconductor layer 120 may include a silicon-based semiconductor material, for example, polysilicon. Alternatively, the first semiconductor layer 120 may include an oxide-based semiconductor material. The first semiconductor layer 120 may include the channel region, and a first region and a second region arranged at opposite sides of the channel region, respectively. The first region and the second region may include a higher concentration of impurities than the channel region. Alternatively, the first and second regions may be conductive regions, wherein one of the first region and the second region may be a source region and the other one may correspond to a drain region.

A gate insulating layer 130 may be arranged between the first semiconductor layer 120 and the first gate electrode 140. The gate insulating layer 130 may include an inorganic insulating material such as silicon nitride, silicon oxynitride, and silicon oxide and may be a single layer or a multilayer, which includes the above-described inorganic insulating material.

A first interlayer insulating layer 150 may be disposed on the first gate electrode 140. The first interlayer insulating layer 150 may include an inorganic insulating material such as silicon nitride, silicon oxynitride, and silicon oxide and may be a single layer or a multilayer, which includes the above-described inorganic insulating material.

Figure 4:
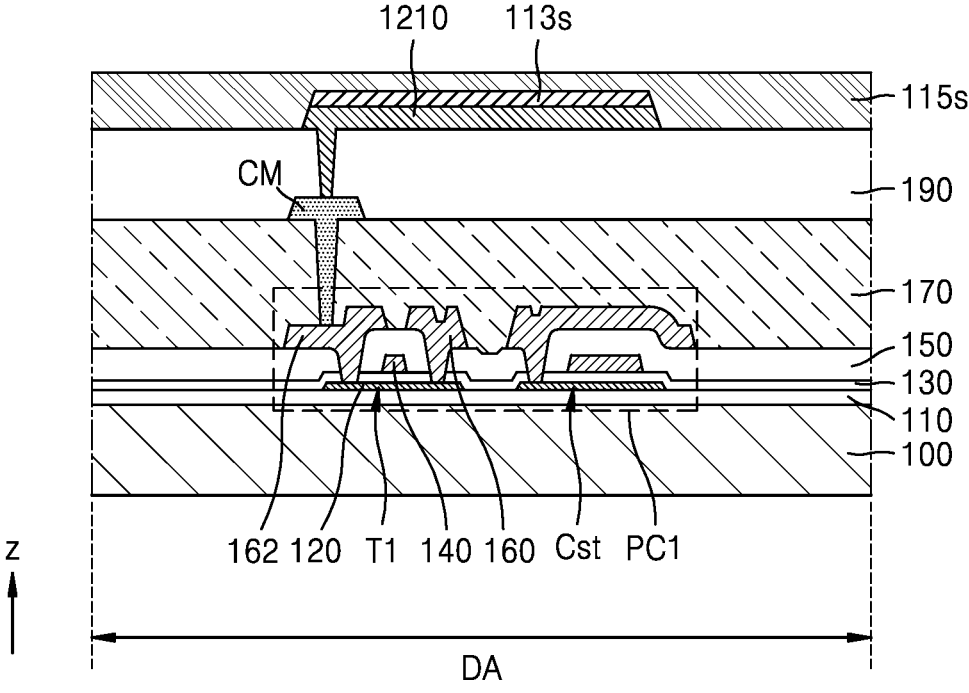

A source electrode 160 and a drain electrode 162 may be connected to the source region and the drain region of the first semiconductor layer 120, respectively. A first organic insulating layer 170 may be disposed on the source electrode 160 and the drain electrode 162. The first organic insulating layer 170 may include an organic insulating material. The storage capacitor Cst may include at least two capacitor electrodes overlapping each other, and in an embodiment, FIG. 4 illustrates a first capacitor electrode on the same layer as the first semiconductor layer 120, a second capacitor electrode on the same layer as the first gate electrode 140, and a third capacitor electrode on the same layer as the source electrode 160 and/or the drain electrode 162. Each of the source electrode 160 and the drain electrode 162 may include aluminum (Al), copper (Cu), and/or titanium (Ti) and may be formed as a single layer or a multilayer, which includes the above-described material.

A connection metal CM may be disposed on the first organic insulating layer 170, and the first subpixel electrode 1210 of a first light-emitting diode LED1 (see FIG. 10) may be connected to the connection metal CM via a contact hole formed in a second organic insulating layer 190. The connection metal CM may electrically connect the first subpixel circuit PC1 with the first subpixel electrode 1210 of the first light-emitting diode LED1 (see FIG. 10). The first organic insulating layer 170 may include an organic insulating material such as acryl, benzocyclobutene ("BCB"), polyimide, or hexamethyldisiloxane ("HMDSO"). The connection metal CM may include aluminum (Al), copper (Cu), and/or titanium (Ti) and may be formed as a single layer or a multilayer, which includes the above-described material.

In another embodiment, the first subpixel electrode 1210 of the first light-emitting diode LED1 (see FIG. 10) may be electrically connected to the first subpixel circuit PC1. In another embodiment, a plurality of connection metals disposed on different layers may be arranged between the first subpixel electrode 1210 of the first light-emitting diode LED1 (see FIG. 10) and the first subpixel circuit PC1, and the first subpixel electrode 1210 of the first light-emitting diode LED1 (see FIG. 10) and the first subpixel circuit PC1 may be electrically connected with each other via the plurality of connection metals.

The first subpixel electrode 1210 of the first light-emitting diode LED1 may be disposed on the second organic insulating layer 190. The second organic insulating layer 190 may include an organic insulating material such as acryl, benzocyclobutene (BCB), polyimide, or hexamethyldisiloxane (HMDSO).

The first subpixel electrode 1210 may include a metal and/or a conductive oxide. For example, the first subpixel electrode 1210 may include a reflective film including Ag, Mg, Al, Pt, Pd, Au, Ni, Nd, Ir, Cr, or a compound thereof, and a film including ITO, IZO, ZnO, or $In_2O_3$ below and/or above the reflective film. In an embodiment, the first subpixel electrode 1210 may have a structure in which an ITO layer, an Ag layer, and an ITO layer are sequentially stacked.

The conductive passivation layer-forming material 113s may be disposed on the first subpixel electrode 1210. The conductive passivation layer-forming material 113s may be arranged to be in contact with the upper surface of the first subpixel electrode 1210. Specifically, the conductive passivation layer-forming material 113s may be disposed only on the upper surface of the first subpixel electrode 1210. The conductive passivation layer-forming material 113s may include at least one conductive oxide selected from among indium tin oxide ("ITO"), indium zinc oxide ("IZO"), indium gallium zinc oxide ("IGZO"), indium tin zinc oxide ("ITZO"), ZnO, aluminum doped zinc oxide ("AZO"), gallium doped zinc oxide ("GZO"), zinc tin oxide ("ZTO"), gallium tin oxide ("GTO"), and fluorine doped tin oxide ("FTO").

Referring to FIG. 4, an insulating layer-forming material 115s may be disposed on the first subpixel electrode 1210. In other words, the insulating layer-forming material 115s may be disposed on the conductive passivation layer-forming material 113s. The insulating layer-forming material 115s may be consecutively formed on the substrate 100.

The insulating layer-forming material 115s may include an inorganic insulating material. When the insulating layer-forming material 115s includes an inorganic insulating material, deterioration of the quality of a light-emitting diode due to gas emitted from the insulating layer 115 (see FIG. 9) including an organic insulating material during a process for manufacturing the display apparatus 1 may be prevented or minimized, compared to a case where the insulating layer-forming material 115s includes an organic insulating material.

The insulating layer-forming material 115s may include an inorganic insulating material such as silicon oxide, silicon nitride, silicon oxynitride and may include a single layer or a multilayer, which includes the above-described inorganic insulating material.

Figure 5:
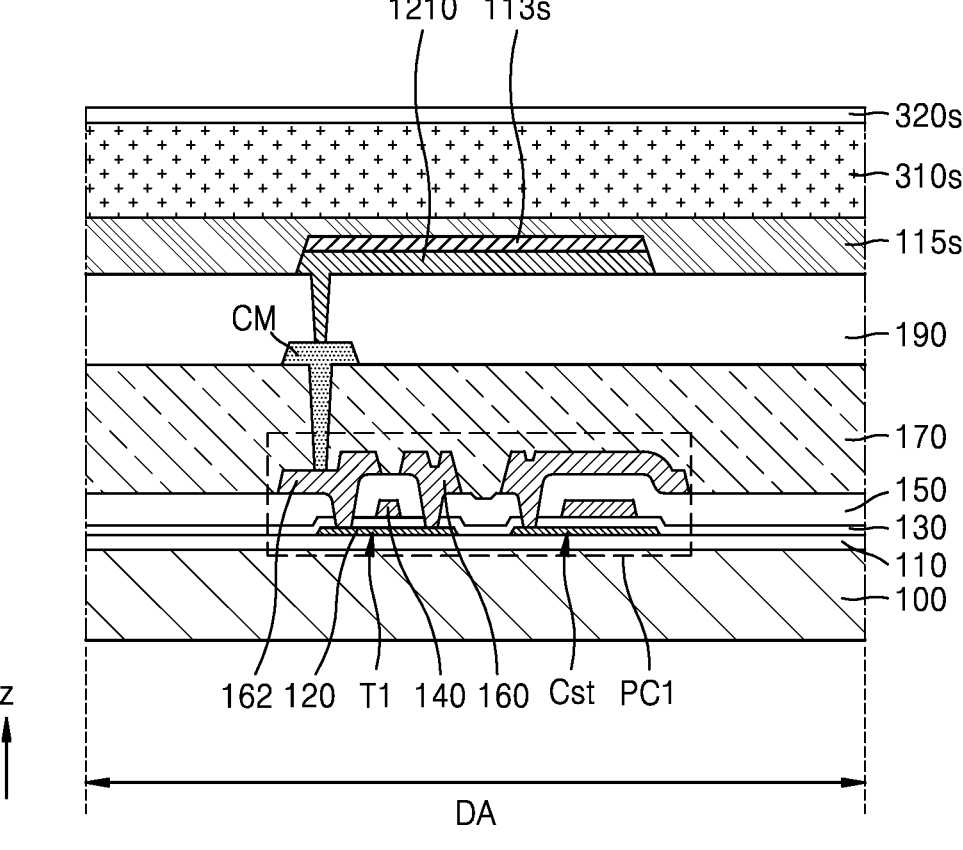

Referring to FIG. 5, a first conductive layer-forming material 310s and a second conductive layer-forming material 320s may be disposed on the insulating layer-forming material 115s. The first conductive layer-forming material 310s may be disposed on the insulating layer-forming material 115s, and the second conductive layer-forming material 320s may be disposed on the first conductive layer-forming material 310s. The second conductive layer-forming material 320s may be arranged to be in contact with an upper surface of the first conductive layer-forming material 310s. The first conductive layer-forming material 310s and the second conductive layer-forming material 320s may be consecutively formed on the substrate 100.

The etch rates of the first conductive layer-forming material 310s and the second conductive layer-forming material 320s may be different from each other. The wet etch rates of the first conductive layer-forming material 310s and the second conductive layer-forming material 320s may be different from each other. The etch rate of the first conductive layer-forming material 310s may be greater than the etch rate of the second conductive layer-forming material 320s. The wet etch rate of the first conductive layer-forming material 310s may be greater than the wet etch rate of the second conductive layer-forming material 320s. In an etching process, the etching speed of the first conductive layer-forming material 310s may be greater than the etching speed of the second conductive layer-forming material 320s. Since the etch rates of the first conductive layer-forming material 310s and the second conductive layer-forming material 320s are different from each other, the first conductive layer 310 (see FIG. 7) and the second conductive layer 320 (see FIG. 7) may be formed to have an undercut structure.

The first conductive layer-forming material 310s may include a titanium (Ti)-copper (Cu) alloy. The second conductive layer-forming material 320s may include titanium (Ti). The thickness of the first conductive layer-forming material 310s may be at least 4,000 angstroms (Å) and not more than 7,000 Å. The thickness of the second conductive layer-forming material 320s may be about 500 Å to about 1,000 Å.

Figure 6:
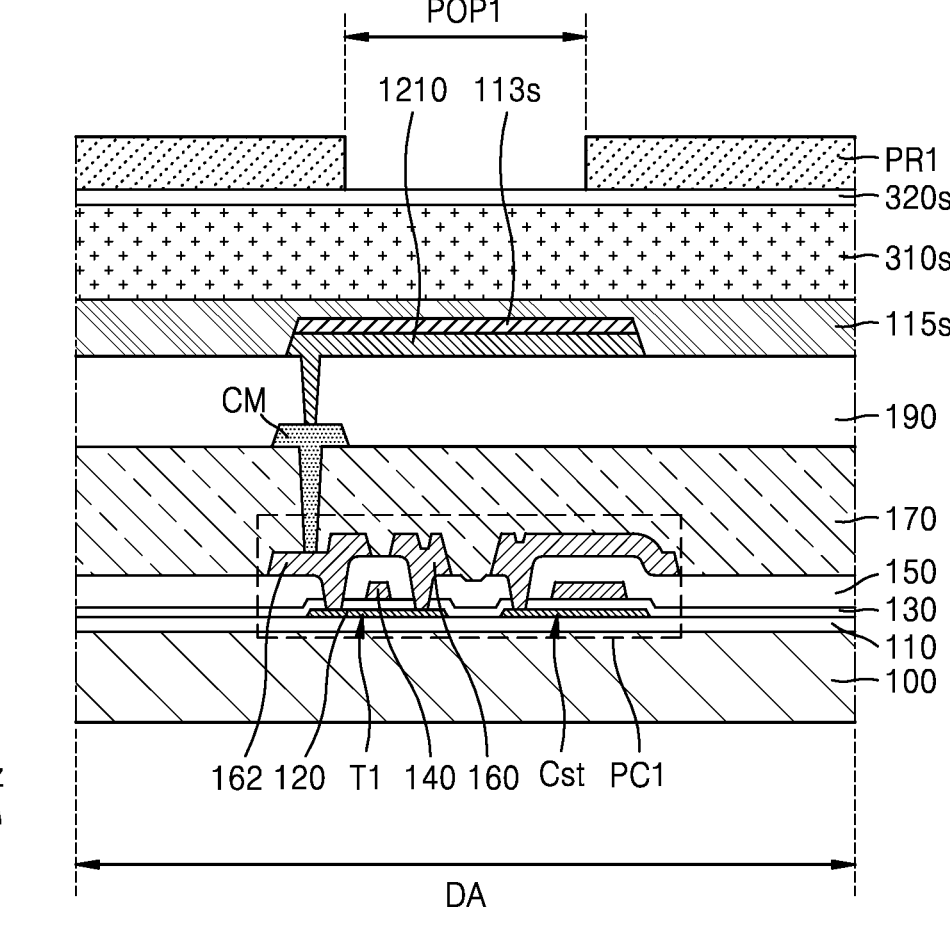

Referring to FIG. 6, a first photoresist PR1 may be disposed on at least a portion of the second conductive layer-forming material 320s. The first photoresist PR1 may have a first opening region POP1. The first opening region POP1 of the first photoresist PR1 may overlap the first subpixel electrode 1210.

Figure 7:
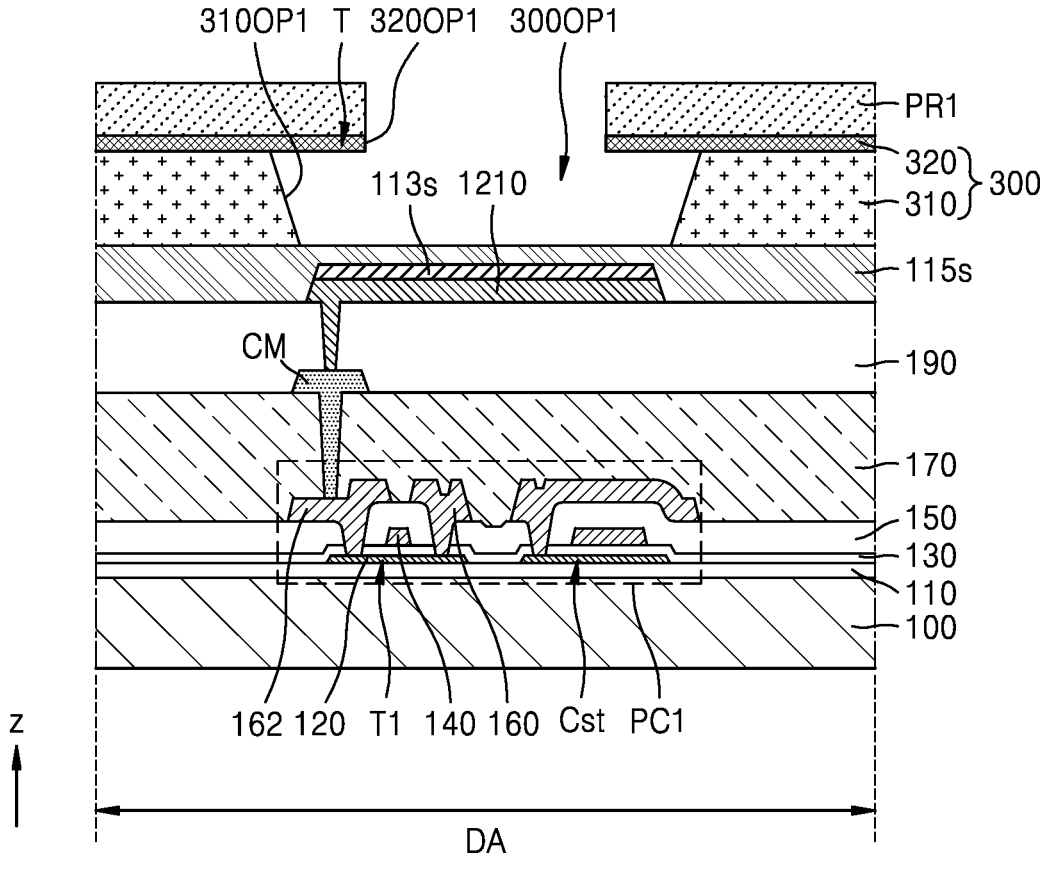

Referring to FIG. 7, at least a portion of the first conductive layer-forming material 310s and at least a portion of the second conductive layer-forming material 320s may be removed by using the first photoresist PR1 as a mask. At least a portion of the first conductive layer-forming material 310s and at least a portion of the second conductive layer-forming material 320s may be removed by wet etching. During an etching process, the conductive passivation layer-forming material 113s may protect the first subpixel electrode 1210 below the conductive passivation layer-forming material 113s.

At least a portion of the first conductive layer-forming material 310s may be etched to form the first conductive layer 310. A portion of the first conductive layer-forming material 310s, which does not overlap the first photoresist PR1, may be etched to form the first conductive layer 310. At least a portion of the second conductive layer-forming material 320s may be etched to form the second conductive layer 320. A portion of the second conductive layer-forming material 320s, which does not overlap the first photoresist PR1, may be etched to form the second conductive layer 320.

The wet etch rate of the first conductive layer-forming material 310s may be greater than the wet etch rate of the second conductive layer-forming material 320s. In other words, the degree at which the first conductive layer-forming material 310s is etched may be greater than the degree at which the second conductive layer-forming material 320s is etched. After the etching process, the conductive bank layer 300 may be formed to have an overhang structure. The width of an opening 310OP1 of the first conductive layer 310 may be greater than the width of an opening 320OP1 of the second conductive layer 320. The conductive bank layer 300 may be formed to have an undercut structure. The second conductive layer 320 of the conductive bank layer 300 may be disposed on an upper surface of the first conductive layer 310, and the second conductive layer 320 may include a tip T protruding toward the first opening 300OP1 of the conductive bank layer 300 from a point where the upper surface of the first conductive layer 310 and a bottom surface of the second conductive layer 320 meet.

In an embodiment, the opening 310OP1 of the first conductive layer 310 may have a shape in which the width decreases toward a lower portion of the opening 310OP1. For example, the width of an upper portion of the opening 310OP1 of the first conductive layer 310 may be greater than the width of the lower portion thereof.

The conductive bank layer 300 may include the first opening 300OP1 penetrating the conductive bank layer 300 in a thickness direction (i.e., z direction) of the conductive bank layer 300. The first opening 300OP1 of the conductive bank layer 300 may overlap the first subpixel electrode 1210.

FIG. 7 illustrates that the conductive bank layer 300 includes two conductive layers, but the disclosure is not limited thereto. In another embodiment, the conductive bank layer 300 may further include a third conductive layer below the first conductive layer 310, in addition to the first conductive layer 310 and the second conductive layer 320 on the first conductive layer 310.

Figure 8:
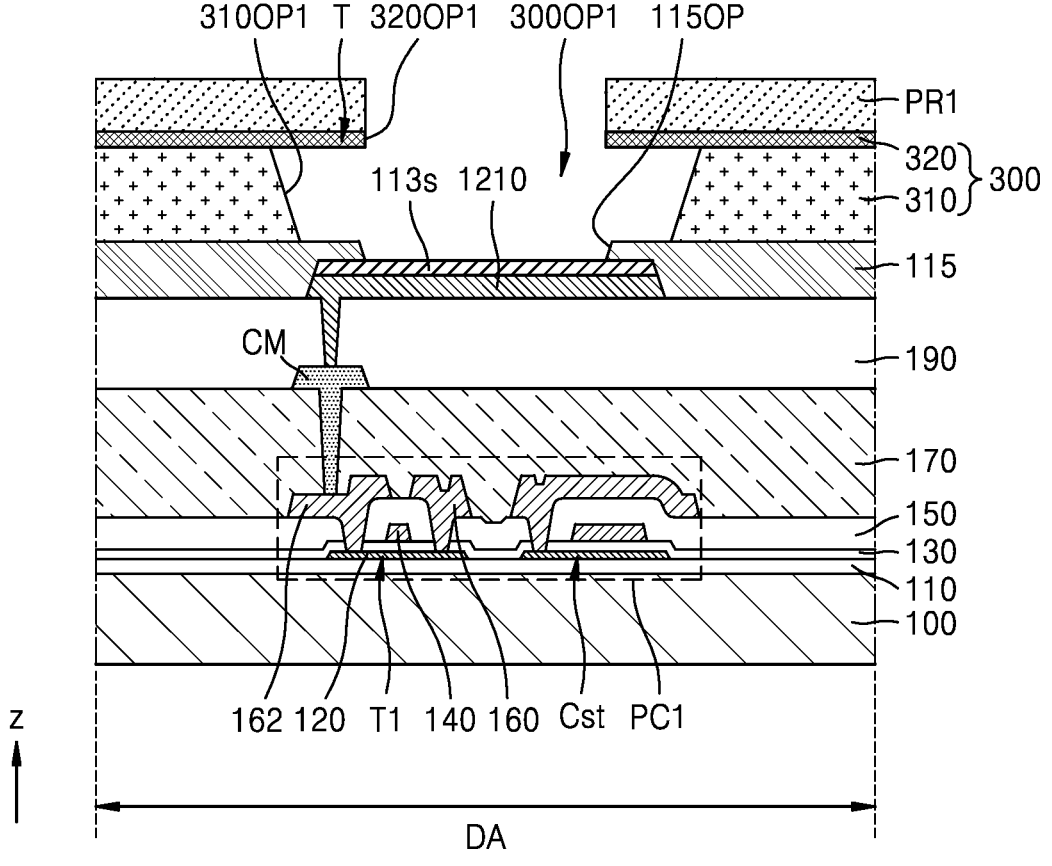

Although not shown, an insulating passivation layer may be arranged between the conductive bank layer 300 and the insulating layer 115 (see FIG. 8). The insulating passivation layer may include an amorphous inorganic insulating material such as silicon oxide and/or silicon nitride. In a process for forming the first conductive layer 310 and the second conductive layer 320 by wet etching the first conductive layer-forming material 310s and the second conductive layer-forming material 320s, respectively, the insulating passivation layer may protect the first subpixel electrode 1210 under the insulating passivation layer.

In the related art, in order to form the conductive bank layer to have an overhang structure, after at least a portion of the first conductive layer-forming material and at least a portion of the second conductive layer-forming material are removed by dry etching, at least a portion of the first conductive layer-forming material may be further removed by wet etching. The first conductive layer-forming material and/or the second conductive layer-forming material may be subjected to two processes that are a dry etching process and a wet etching process to form the overhang structure of the conductive bank layer.

In an embodiment, the first conductive layer-forming material 310s may include a titanium (Ti)-copper (Cu) alloy, and the second conductive layer-forming material 320s may include titanium (Ti). The wet etch rate of the first conductive layer-forming material 310s may be greater than the wet etch rate of the second conductive layer-forming material 320s. The conductive bank layer 300 may be formed to have an overhang structure by etching the first conductive layer-forming material 310s more than the second conductive layer-forming material 320s via a single process that is a wet etching process. Since the overhang structure of the conductive bank layer 300 is formed via a single wet etching process, cost and time required for the process may be reduced, and the process efficiency of the display apparatus 1 may be increased.

Referring to FIG. 8, at least a portion of the insulating layer-forming material 115s may be etched to form the insulating layer 115. A portion of the insulating layer-forming material 115s, which does not overlap the first photoresist PR1, may be etched to form the insulating layer 115. At least a portion of the insulating layer-forming material 115s may be removed by dry etching. The insulating layer 115 may be arranged between a peripheral portion of the first subpixel electrode 1210 and the conductive bank layer 300 and may include an opening overlapping the first opening 300OP1 of the conductive bank layer 300.

The insulating layer 115 may electrically insulate the conductive bank layer 300 from the first subpixel electrode 1210. The insulating layer 115 may be entirely formed over the substrate 100. For example, the insulating layer 115 may extend beyond an overlapping structure of the first subpixel electrode 1210 and a conductive passivation layer 113 (see FIG. 9) and may be in direct contact with an upper surface of the second organic insulating layer 190, on which a conductive passivation layer does not exist. The insulating layer 115 may cover a side surface of each of the first subpixel electrode 1210 and the conductive passivation layer 113 (see FIG. 9). The insulating layer 115 may include an inorganic insulating material. When the insulating layer 115 includes an inorganic insulating material, deterioration of the quality of a light-emitting diode due to gas emitted from the insulating layer 115 including an inorganic insulating material during a process for manufacturing the display apparatus 1 may be prevented or minimized, compared to a case where the insulating layer 115 includes an organic insulating material.

The insulating layer 115 may include an inorganic insulating material such as silicon oxide, silicon nitride, silicon oxynitride and may include a single layer or a multilayer, which includes the above-described inorganic insulating material. The insulating layer 115 may include the first opening 300OP1 of the conductive bank layer 300 and the opening 115OP overlapping the first subpixel electrode 1210.

Figure 9:
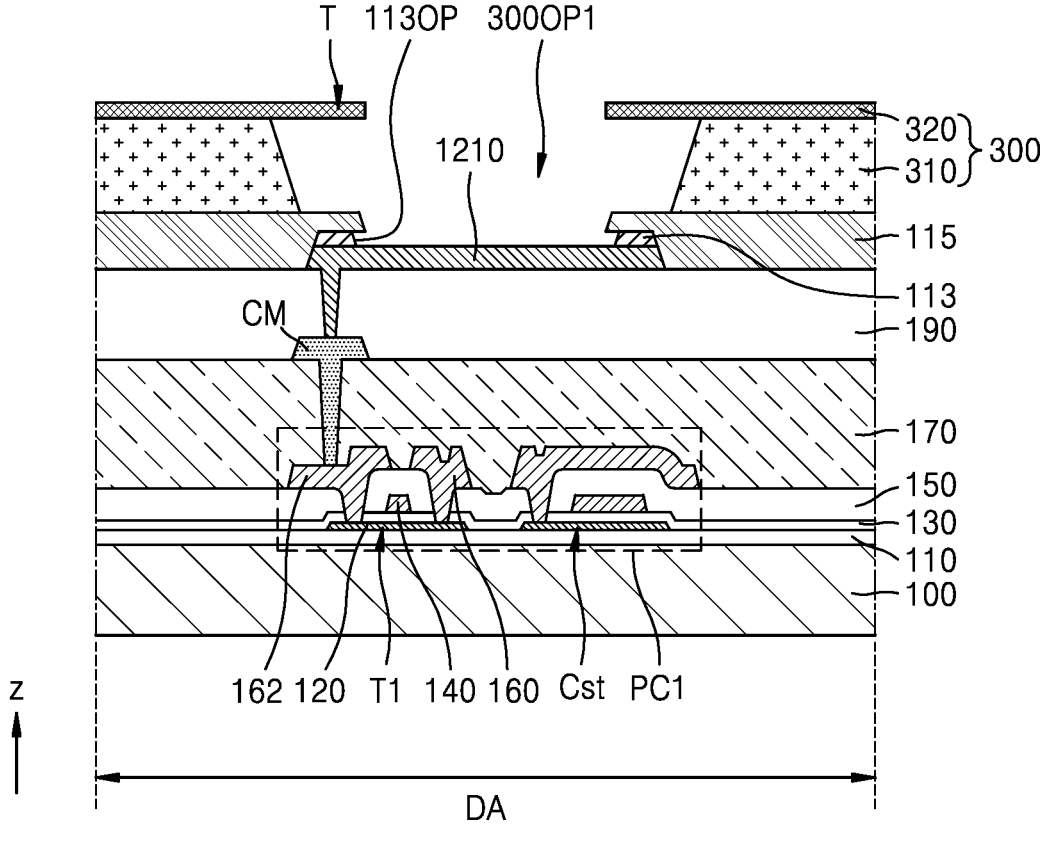

Referring to FIG. 9, at least a portion of the conductive passivation layer-forming material 113s may be etched to form the conductive passivation layer 113. At least a portion of the conductive passivation layer-forming material 113s may be removed via a wet etching process.

The conductive passivation layer 113 may be formed on the first subpixel electrode 1210. The conductive passivation layer 113 may overlap an outer portion of the first subpixel electrode 1210 and may include an opening overlapping an inner portion of the first subpixel electrode 1210. In the present specification, the expression "outer portion (or peripheral portion) of A" indicates "a portion of A, which includes an edge of A", and the expression "inner portion of A" indicates another portion of A, which is surrounded by the outer portion (or peripheral portion).

The conductive passivation layer 113 may prevent the first subpixel electrode 1210 from being damaged by materials used in various processes (for example, an etching process or an ashing process) included in a process for manufacturing the display apparatus 1. The conductive passivation layer 113 may include at least one conductive oxide selected from among indium tin oxide (ITO), indium zinc oxide (IZO), indium gallium zinc oxide (IGZO), indium tin zinc oxide (ITZO), ZnO, aluminum doped zinc oxide (AZO), gallium doped zinc oxide (GZO), zinc tin oxide (ZTO), gallium tin oxide (GTO), and fluorine doped tin oxide (FTO).

Figure 10:
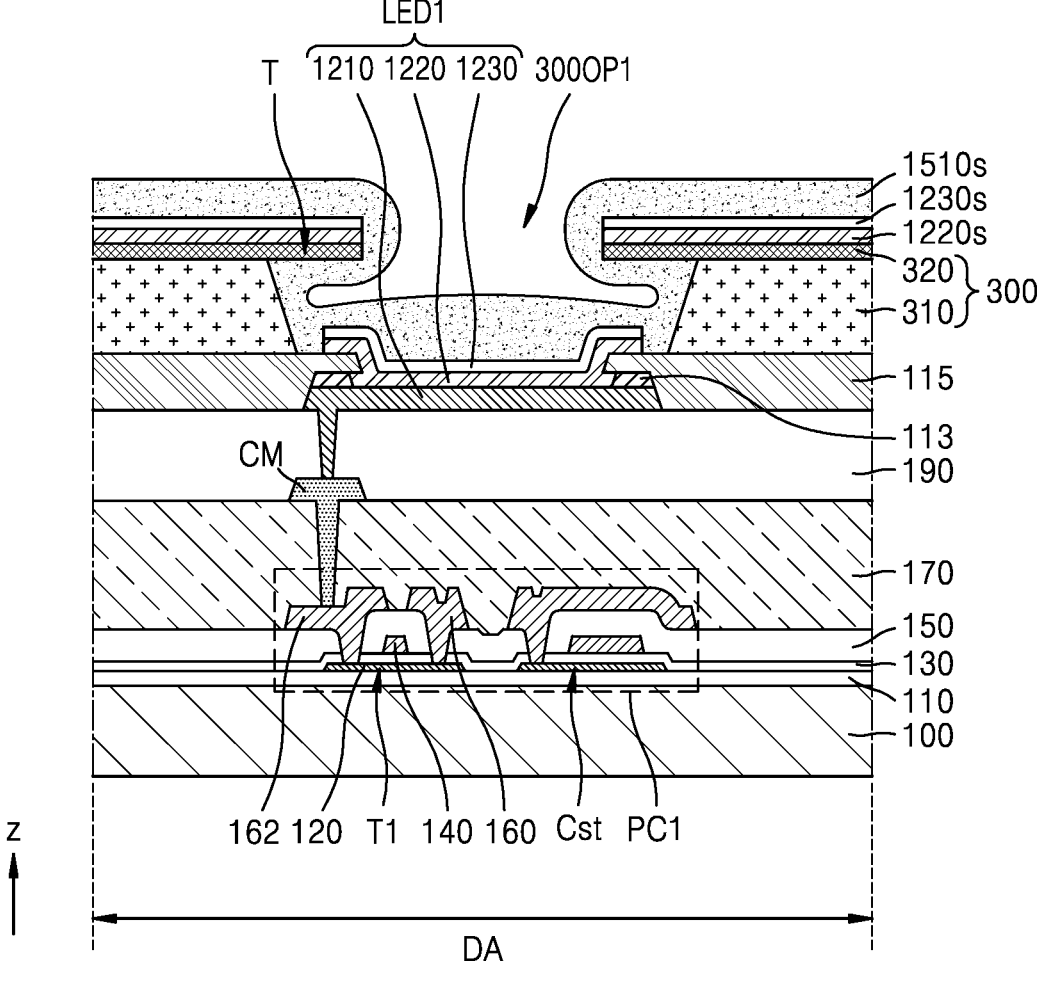

Referring to FIG. 10, a first intermediate layer-forming material 1220s, a first opposite electrode forming material 1230s, and the first inorganic passivation layer-forming material 1510s may be consecutively disposed over the substrate 100. Specifically, the first intermediate layer-forming material 1220s, the first opposite electrode forming material 1230s, and the first inorganic passivation layer-forming material 1510s may be consecutively disposed on the conductive bank layer 300 and the first subpixel electrode 1210. In other words, the first inorganic passivation layer-forming material 1510s may be disposed on the first intermediate layer 1220 and the first opposite electrode 1230. The first inorganic passivation layer-forming material 1510s may be disposed on the first opposite electrode 1230 and the conductive bank layer 300. The first intermediate layer-forming material 1220s and the first opposite electrode forming material 1230s may be formed via a deposition method such as a thermal deposition method. The first inorganic passivation layer-forming material 1510s may be deposited via a method such as a chemical vapor deposition method.

The first opposite electrode forming material 1230s may include a conductive material having a low work function. For example, the first opposite electrode forming material 1230s may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the first opposite electrode forming material 1230s may further include a layer including ITO, IZO, ZnO, or $In_2O_3$ on the (semi)transparent layer including the above-described material.

The first inorganic passivation layer-forming material 1510s may include at least one inorganic insulating material among aluminum oxide, titanium oxide, tantalum oxide, hafnium oxide, zinc oxide, silicon oxide, silicon nitride, and silicon oxynitride, and in an embodiment, the first intermediate layer-forming material 1220s may be arranged to be in contact with an upper surface of the first subpixel electrode 1210 to form the first intermediate layer 1220. The first intermediate layer-forming material 1220s may be arranged in the first opening 300OP1 of the conductive bank layer 300 to form the first intermediate layer 1220. The first intermediate layer 1220 overlapping the first subpixel electrode 1210 may be formed via the first opening 300OP1 of the conductive bank layer 300. In addition, the first opposite electrode forming material 1230s may be arranged, over the first subpixel electrode 1210, to be in contact with an upper surface of the first intermediate layer 1220 to form the first opposite electrode 1230. The first opposite electrode forming material 1230s may be arranged in the first opening 300OP1 of the conductive bank layer 300 to form the first opposite electrode 1230. The first opposite electrode 1230 overlapping the first subpixel electrode 1210 may be arranged via the first opening 300OP1 of the conductive bank layer 300.

The display region DA of the display apparatus 1 may include the first light-emitting diode LED1 disposed over the substrate 100. The first light-emitting diode LED1 may include the first subpixel electrode 1210, the first intermediate layer 1220 on the first subpixel electrode 1210, and the first opposite electrode 1230 on the first intermediate layer 1220, and may emit first-color light.

The first intermediate layer 1220 may be in direct contact with the first subpixel electrode 1210 via the opening 115OP (see FIG. 8) of the insulating layer 115. For example, an inner portion of the first intermediate layer 1220 may overlap and contact with the first subpixel electrode 1210, and an outer portion thereof may extend onto the insulating layer 115 to overlap and contact with the insulating layer 115. The first intermediate layer 1220 arranged between the first opposite electrode 1230 and the first subpixel electrode 1210 may emit first-color light. The width of the opening 115OP (see FIG. 8) of the insulating layer 115 may correspond to the width of an emission region of the first light-emitting diode LED1.

Although not shown, the first intermediate layer 1220 may include a first common layer, a second common layer, and a first emission layer arranged between the first common layer and the second common layer. The first intermediate layer 1220 may include a common layer arranged between the first subpixel electrode 1210 and the first emission layer and/or between the first emission layer and the first opposite electrode 1230. Hereinafter, a common layer arranged between the first subpixel electrode 1210 and the first emission layer is referred to as the first common layer, and a common layer arranged between the first emission layer and the first opposite electrode 1230 is referred to as the second common layer.

The first emission layer may include a polymer or low-molecular-weight organic material emitting light of a certain color (red color, green color, or blue color). In another embodiment, the first emission layer may include an inorganic material or quantum dots.

The first common layer may include a hole transport layer ("HTL") and/or a hole injection layer ("HIL"). The second common layer may include an electron transport layer ("ETL") and/or an electron injection layer ("EIL"). The first common layer and the second common layer may include an organic material.

An inner portion of the first opposite electrode 1230 may overlap the first intermediate layer 1220 and the first subpixel electrode 1210, and an outer portion thereof may extend onto the insulating layer 115 to overlap the insulating layer 115. Although not shown, in an embodiment, the width of the first opposite electrode 1230 may be greater than the width of the first intermediate layer 1220. In other words, the outer portion of the first opposite electrode 1230 may further extend beyond an edge of the first intermediate layer 1220 and may be in direct contact with the conductive bank layer 300. For example, the outer portion of the first opposite electrode 1230 may be in direct contact with a portion of a side surface (for example, lower portion of the side surface) of the first conductive layer 310 of the conductive bank layer 300. In addition, although not shown, a first capping layer may be disposed on the first opposite electrode 1230. The first opposite electrode 1230 may be protected by the first capping layer disposed on the first opposite electrode 1230. The first capping layer may include an organic material or an inorganic material. An outer portion of the first capping layer may extend beyond an edge of the first opposite electrode 1230 and may be in direct contact with the conductive bank layer 300.

Figure 11:
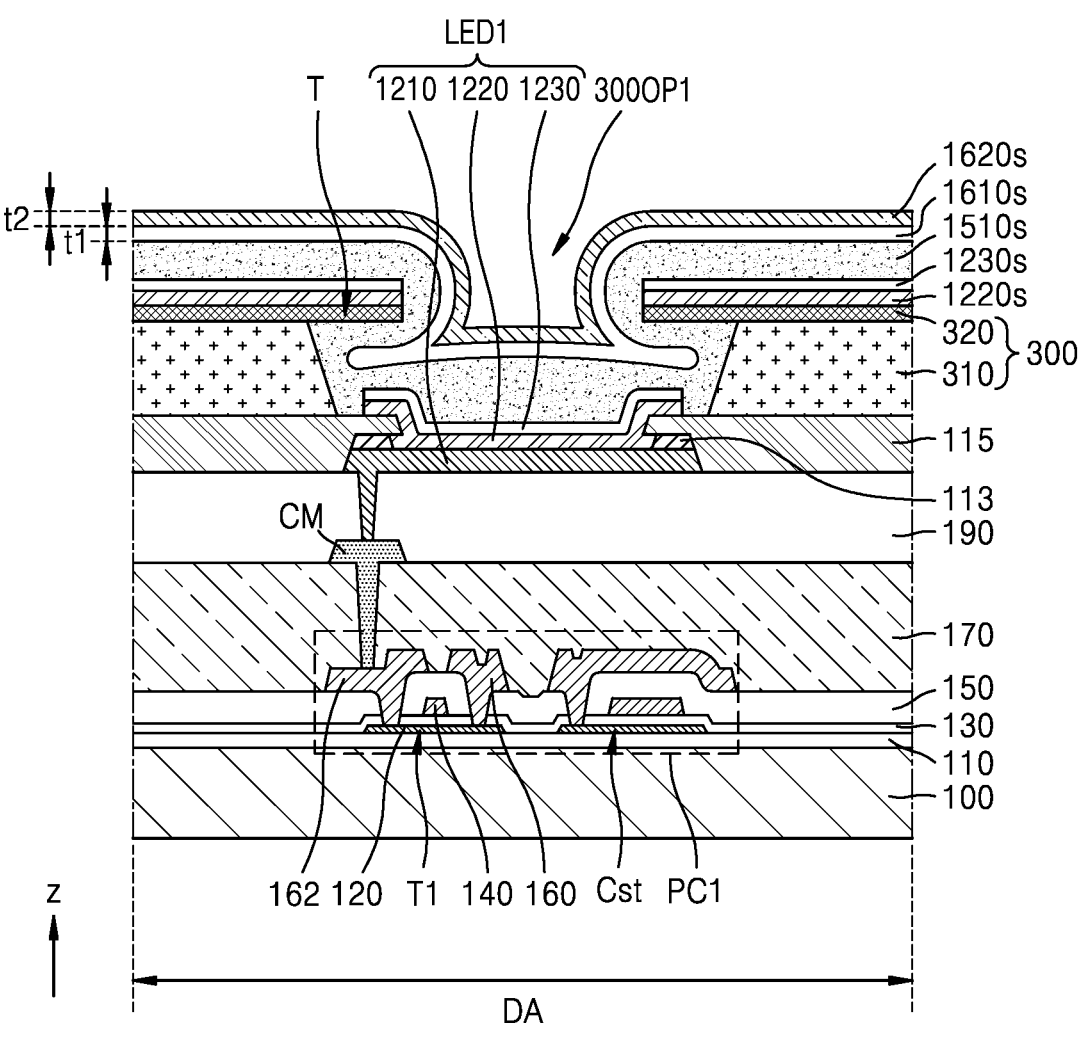

Referring to FIG. 11, a first metal layer-forming material 1610s and a second metal layer-forming material 1620s may be disposed on at least a portion of the first inorganic passivation layer-forming material 1510s. The second metal layer-forming material 1620s may be disposed on the first metal layer-forming material 1610s. Specifically, the second metal layer-forming material 1620s may be arranged to be in contact with an upper surface of the first metal layer-forming material 1610s. The first metal layer-forming material 1610s and the second metal layer-forming material 1620s may be consecutively formed over the substrate 100.

The first metal layer-forming material 1610s may include aluminum (Al). The second metal layer-forming material 1620s may include indium gallium zinc oxide (IGZO). In addition, the second metal layer-forming material 1620s may include at least one conductive oxide selected from among indium tin oxide (ITO), indium zinc oxide (IZO), indium gallium zinc oxide (IGZO), indium tin zinc oxide (ITZO), ZnO, aluminum doped zinc oxide (AZO), gallium doped zinc oxide (GZO), zinc tin oxide (ZTO), gallium tin oxide (GTO), and fluorine doped tin oxide (FTO).

A thickness t1 of the first metal layer-forming material 1610s may be about 500 Å to about 1,000 Å. The thickness t1 of the first metal layer-forming material 1610s in a vertical direction (for example, z direction or −z direction) of the substrate 100 may be about 500 Å to about 1,000 Å. A thickness t2 of the second metal layer-forming material 1620s may be about 1,000 Å to about 2,000 Å. The thickness t2 of the second metal layer-forming material 1620s in the vertical direction of the substrate 100 may be about 1,000 Å to about 2,000 Å. However, the disclosure is not limited thereto.

Figure 12:
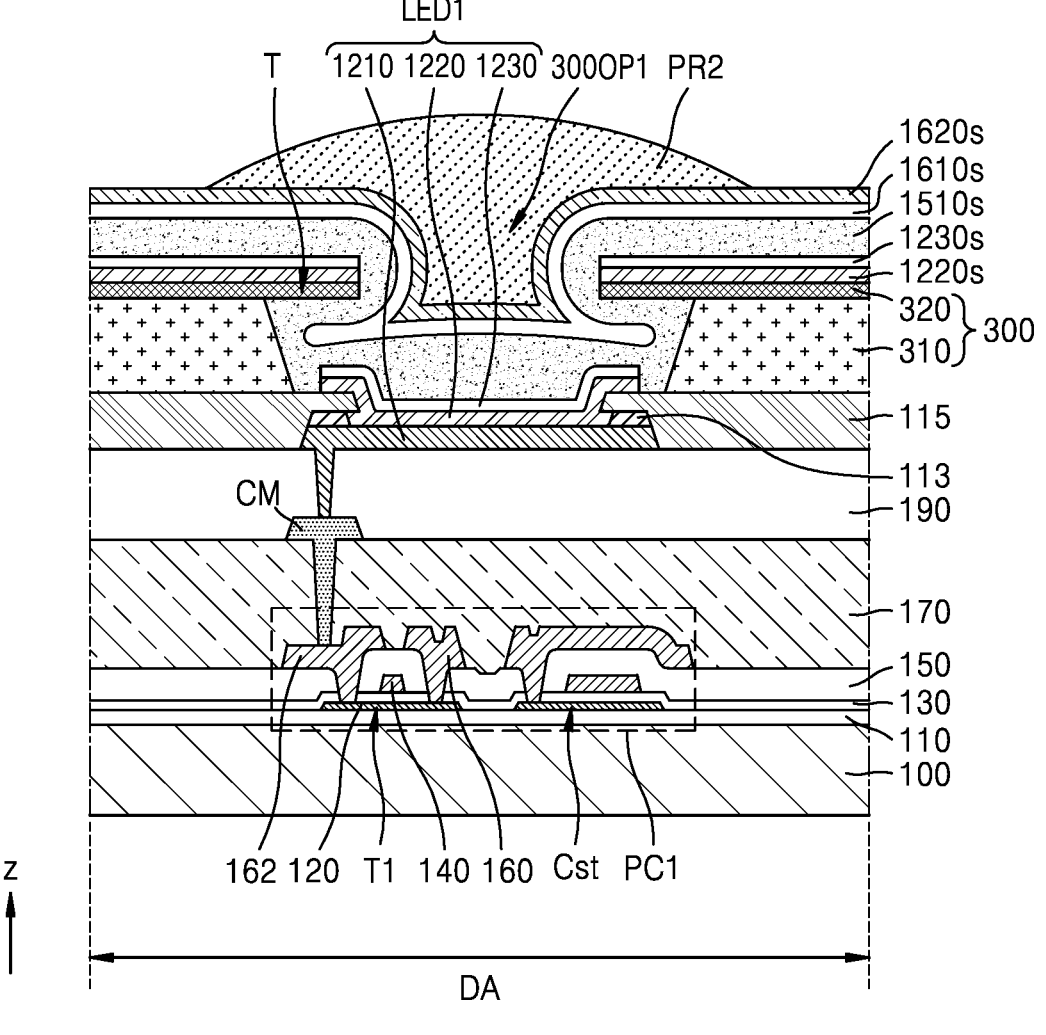

Referring to FIG. 12, a second photoresist PR2 may be disposed on at least a portion of the second metal layer-forming material 1620s. The second photoresist PR2 may be arranged to overlap the first opening 300OP1 of the conductive bank layer 300. The second photoresist PR2 may be arranged to overlap the first subpixel electrode 1210.

Figure 13:
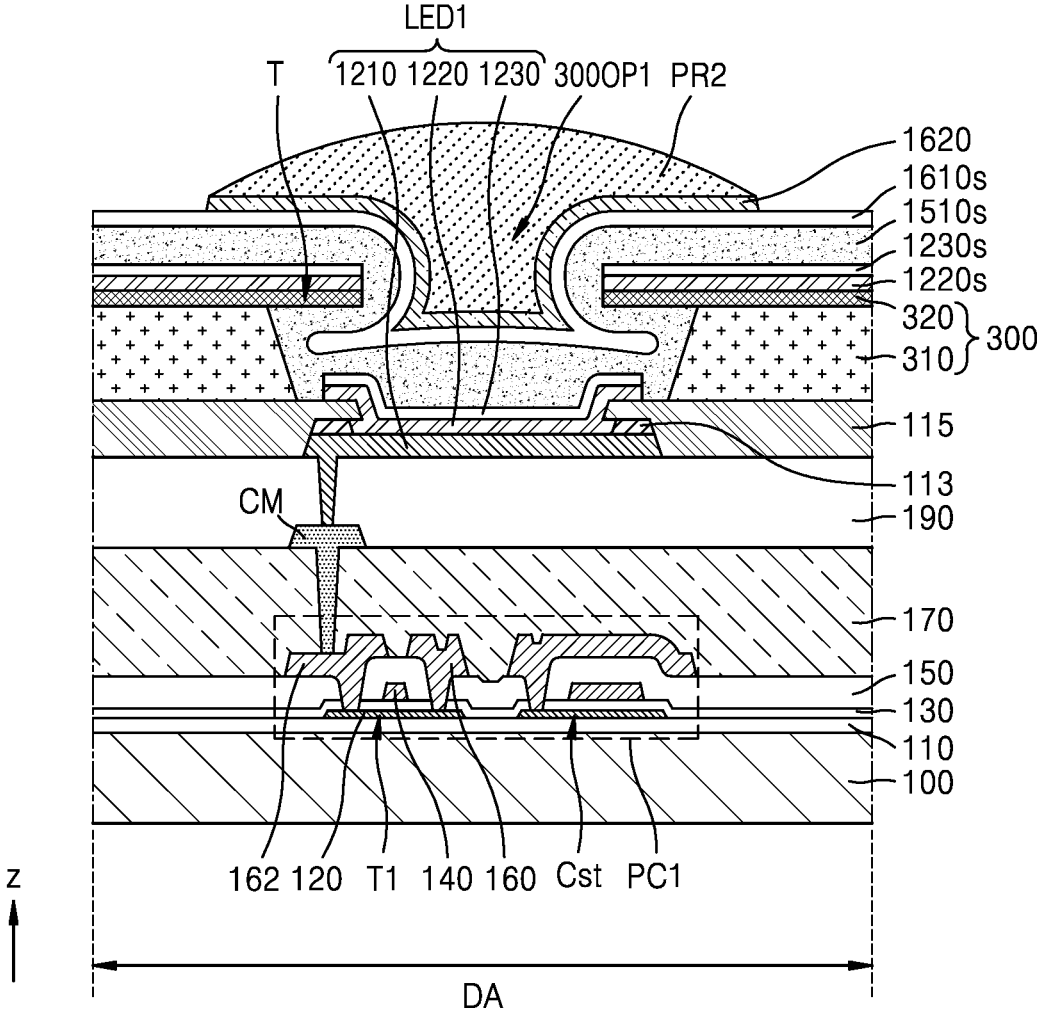
Figure 14:
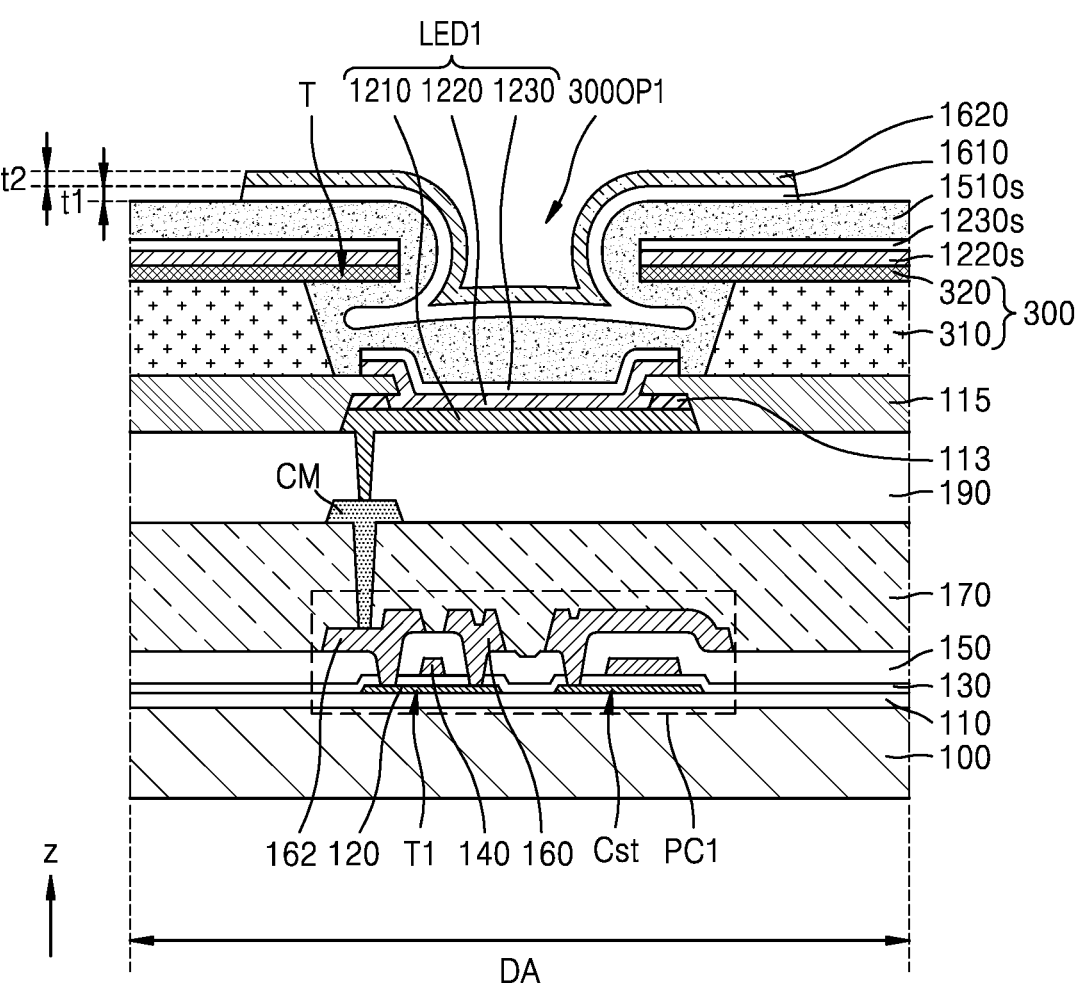

Referring to FIGS. 13 and 14, at least a portion of the second metal layer-forming material 1620s may be etched to form the second metal layer 1620. A portion of the second metal layer-forming material 1620s, which does not overlap the second photoresist PR2, may be etched to form the second metal layer 1620. A portion of the second metal layer-forming material 1620s may be removed by wet etching. At least a portion of the second metal layer-forming material 1620s may be removed by a first etching solution. The first etching solution may be SC-02 solution. However, the disclosure is not limited thereto After the second metal layer 1620 is formed, at least a portion of the first metal layer-forming material 1610s may be etched to form the first metal layer 1610. A portion of the first metal layer-forming material 1610s, which does not overlap the second photoresist PR2, may be etched to form the first metal layer 1610. A portion of the first metal layer-forming material 1610s may be removed by wet etching. At least a portion of the first metal layer-forming material 1610s may be removed by a second etching solution. The second etching solution may be tetramethylammonium hydroxide ("TMAH") solution. However, the disclosure is not limited thereto.

In a process for forming the first metal layer 1610 and the second metal layer 1620 by wet etching at least portions of the first metal layer-forming material 1610s and the second metal layer-forming material 1620s, respectively, the first conductive layer 310 includes a titanium (Ti)-copper (Cu) alloy, and thus, the first conductive layer 310 may not be damaged during wet etching. In a process for forming the first metal layer 1610 and the second metal layer 1620 by wet etching at least portions of the first metal layer-forming material 1610s and the second metal layer-forming material 1620s, respectively, the second conductive layer 320 includes titanium (Ti), and thus, the second conductive layer 320 may not be damaged during wet etching.

In an embodiment, the second metal layer 1620 may be arranged to be in contact with an upper surface of the first metal layer 1610. The first metal layer 1610 and the second metal layer 1620 may be arranged to overlap the first opening 300OP1 of the conductive bank layer 300. The first metal layer 1610 and the second metal layer 1620 may be disposed on the first subpixel electrode 1210 and the second conductive layer 320. The first metal layer 1610 may also be disposed on a side surface of the tip T of the second conductive layer 320, which protrudes toward the first opening 300OP1, and a bottom surface of the tip T of the second conductive layer 320.

Figure 15:
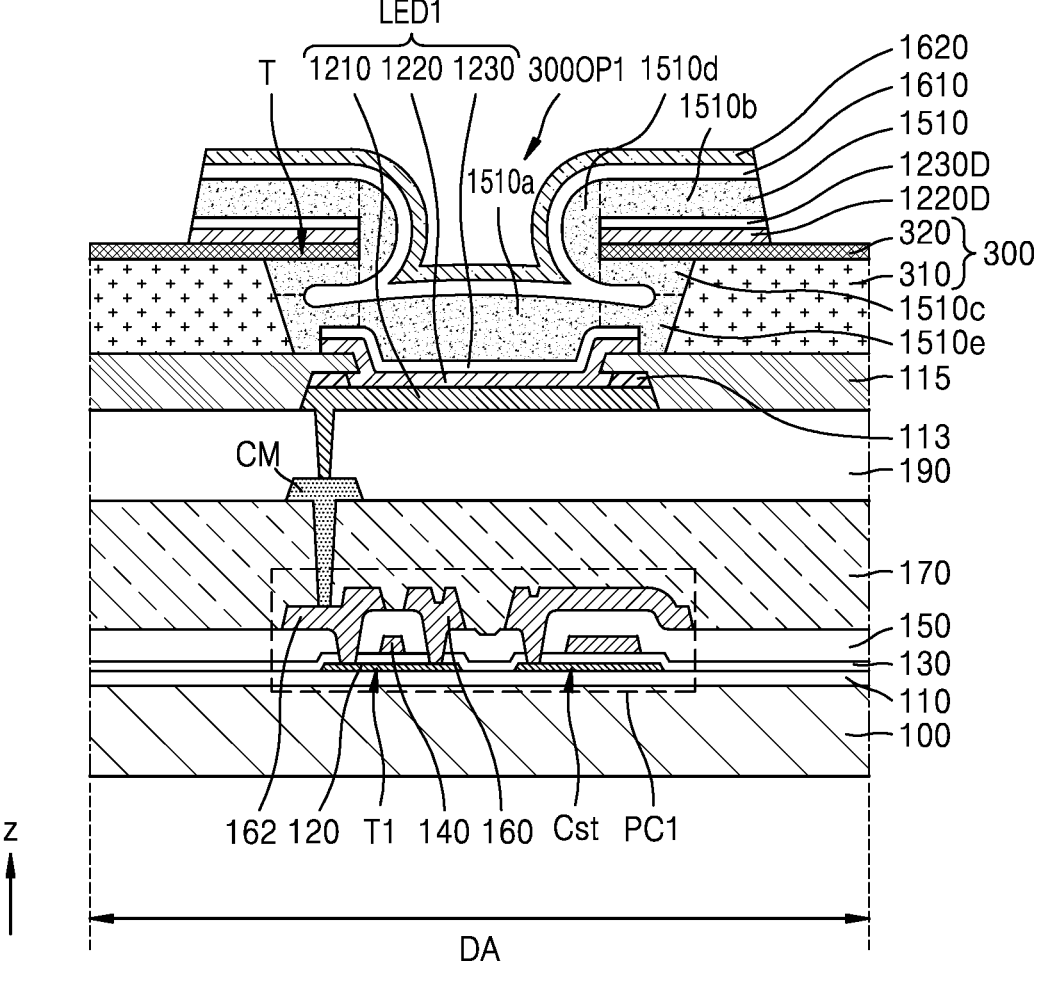

Referring to FIG. 15, at least a portion of the first inorganic passivation layer-forming material 1510s may be etched to form the first inorganic passivation layer 1510. A portion of the first inorganic passivation layer-forming material 1510s, which does not overlap the first metal layer 1610 and the second metal layer 1620, may be etched to form the first inorganic passivation layer 1510 by using the first metal layer 1610 and the second metal layer 1620 as masks.

In an embodiment, the first inorganic passivation layer 1510 may be disposed on the first subpixel electrode 1210 and the second conductive layer 320. The first inorganic passivation layer 1510 may extend to overlap an upper surface and side surface of the conductive bank layer 300 and an upper surface of the first opposite electrode 1230. The first inorganic passivation layer 1510 may include a first portion 1510a, a second portion 1510b, a third portion 1510c, a fourth portion 1510d, and a fifth portion 1510e. The first portion 1510a may be a portion of the first inorganic passivation layer 1510, which overlaps the opening 115OP (see FIG. 8) of the insulating layer 115. The second portion 1510b may be a portion of the first inorganic passivation layer 1510, which overlaps an upper surface of the tip T of the second conductive layer 320, which faces the first opening 300OP1. In other words, the second portion 1510b may be a portion of the first inorganic passivation layer 1510, which is arranged to be overlap an upper surface of the second conductive layer 320. The third portion 1510c may be a portion of the first inorganic passivation layer 1510, which overlaps a bottom surface of the tip T of the second conductive layer 320, which faces the first opening 300OP1. In other words, the third portion 1510c may be a portion of the first inorganic passivation layer 1510, which is arranged to be in contact with the bottom surface of the second conductive layer 320. The fourth portion 1510d may be a portion of the first inorganic passivation layer 1510, which is arranged between the second portion 1510b and the third portion 1510c of the first inorganic passivation layer 1510. In other words, the fourth portion 1510d may be a portion of the first inorganic passivation layer 1510, which is arranged to overlap at least portions of a side surface of the second conductive layer 320 and a side surface of the first conductive layer 310. The fourth portion 1510d may include a rounded surface in a cross-section. The fourth portion 1510d may include a rounded surface along a side surface of the tip T of the second conductive layer 320. The fifth portion 1510e may be a portion of the first inorganic passivation layer 1510, which is arranged between the third portion 1510c and the first portion 1510a of the first inorganic passivation layer 1510. The fifth portion 1510e may be arranged to overlap the bottom surface of the tip T of the second conductive layer 320. The fifth portion 1510e may be arranged, on a lower portion of the third portion 1510c, to overlap the third portion 1510c. In addition, at least a portion of the fifth portion 1510e may overlap at least a portion of the second portion 1510b, which is arranged to overlap the upper surface of the second conductive layer 320. The fifth portion 1510e may be arranged to overlap the side surface of the first conductive layer 310.

Since the first intermediate layer 1220 and the first opposite electrode 1230 are deposited without a separate mask, a deposition material for forming the first intermediate layer 1220 and a deposition material for forming the first opposite electrode 1230 may form a first dummy intermediate layer 1220D and a first dummy opposite electrode 1230D on the conductive bank layer 300. At least portions of the first intermediate layer-forming material 1220s (see FIG. 14) arranged between the first inorganic passivation layer-forming material 1510s and the second conductive layer 320 and the first opposite electrode forming material 1230s (see FIG. 14) may be etched together with the first inorganic passivation layer-forming material 1510s to form the first dummy intermediate layer 1220D and the first dummy opposite electrode 1230D, respectively. Portions of the first intermediate layer-forming material 1220s and the first opposite electrode forming material 1230s on the second conductive layer 320, which do not overlap the first metal layer 1610 and the second metal layer 1620, may be etched to form the first dummy intermediate layer 1220D and the first dummy opposite electrode 1230D by using the first metal layer 1610 and the second metal layer 1620 as masks.

The first dummy intermediate layer 1220D and the first dummy opposite electrode 1230D may be disposed on the upper surface of the second conductive layer 320. Specifically, the first dummy intermediate layer 1220D may be arranged to be in contact with the upper surface of the second conductive layer 320, and the first dummy opposite electrode 1230D may be arranged to be in contact with an upper surface of the first dummy intermediate layer 1220D. The first dummy intermediate layer 1220D and the first intermediate layer 1220 may be separated and apart from each other, and the first opposite electrode 1230 and the first dummy opposite electrode 1230D may be separated and apart from each other. The first intermediate layer 1220 and the first dummy intermediate layer 1220D may include the same material and/or the same number of sublayers (for example, the first common layer, an emission layer, the second common layer). The first opposite electrode 1230 and the first dummy opposite electrode 1230D may include the same material.

In an embodiment, the first inorganic passivation layer 1510 may define a cavity C (See FIG. 17) between the second portion 1510b and the fifth portion 1510e. The cavity C may be disposed under the tip T of the second conductive layer 320. Since the second conductive layer 320 includes the tip T protruding toward the first opening 300OP1, the first inorganic passivation layer 1510 disposed over the substrate 100 is arranged along the tip T of the second conductive layer 320 and thus may define the cavity C under the second conductive layer 320.

The first metal layer 1610 may include aluminum (Al). Aluminum (Al) of the first metal layer 1610 may effectively cover a step difference of the tip T of the second conductive layer 320, which faces the first opening 300OP1. In other words, aluminum (Al) of the first metal layer 1610 may effectively cover an upper surface of the first inorganic passivation layer 1510 defining a cavity C disposed under the tip T of the second conductive layer 320. The first metal layer 1610 may continuously extend to be in contact with the upper surface of the first inorganic passivation layer 1510. The first metal layer 1610 may extend to be in contact with an upper surface of the second portion 1510b of the first inorganic passivation layer 1510. In addition, the first metal layer 1610 may extend to be in contact with the side surface of the tip T of the second conductive layer 320, which protrudes toward the first opening 300OP1. In other words, the first metal layer 1610 may continuously extend to be in contact with an upper surface of the rounded surface of the fourth portion 1510*d* of the first inorganic passivation layer 1510. The first metal layer 1610 may be disposed under the tip T of the second conductive layer 320. Specifically, the first metal layer 1610 may continuously extend to be in contact with the upper surface of the first inorganic passivation layer 1510 and fill the cavity C disposed under the tip T of the second conductive layer 320. In other words, the first metal layer 1610 may continuously extend to be in contact with the third portion 1510*c* of the first inorganic passivation layer 1510 and a rounded upper surface of the fifth portion 1510*e*. The first inorganic passivation layer 1510 may be formed on the first subpixel electrode 1210. The first metal layer 1610 may continuously extend to be in contact with an upper surface of the first portion 1510*a* of the first inorganic passivation layer 1510.

In the related art, in order to form the first inorganic passivation layer 1510 by etching at least a portion of the first inorganic passivation layer-forming material 1510*s*, a single mask including indium gallium zinc oxide (IGZO) may be disposed on a portion of the first inorganic passivation layer-forming material 1510*s*, which overlaps the first subpixel electrode 1210. When the single mask including indium gallium zinc oxide (IGZO) is formed on the first inorganic passivation layer-forming material 1510*s*, the cavity C of the first inorganic passivation layer-forming material 1510*s*, which is disposed under the second conductive layer 320, may not be efficiently covered. In other words, the first inorganic passivation layer-forming material 1510*s* may not efficiently cover the step difference of the tip T of the second conductive layer 320. Since the single mask including indium gallium zinc oxide (IGZO) may not cover an upper surface of the first inorganic passivation layer-forming material 1510*s* defining the cavity C, there is a limitation in depositing the single mask including indium gallium zinc oxide (IGZO). Due to the limitation in depositing the single mask including indium gallium zinc oxide (IGZO), when a subsequent process is performed, moisture or oxygen may permeate through the side surface of the tip T of the second conductive layer 320, and lifting may occur between the first inorganic passivation layer 1510 and the first opposite electrode 1230.

In an embodiment, the first inorganic passivation layer-forming material 1510*s* may be efficiently sealed by arranging a double layer of an Al-containing mask under an indium gallium zinc oxide (IGZO)-containing mask. Aluminum (Al) may effectively cover a rounded surface of a particle or a step difference between layers in a structure of a stack of layers. The aluminum (Al)-containing mask may cover the step difference of the tip T of the second conductive layer 320. In other words, the aluminum (Al)-containing mask may effectively cover a rounded surface of the first inorganic passivation layer-forming material 1510*s* arranged at the side surface of the tip T of the second conductive layer 320, and the upper surface of a portion of the first inorganic passivation layer-forming material 1510*s* disposed on the first opposite electrode 1230 and constituting the cavity C disposed under the tip T of the second conductive layer 320. The first metal layer 1610 may efficiently seal the upper surface of the first inorganic passivation layer-forming material 1510*s* to prevent permeation of moisture or oxygen through the side surface of the tip T of the second conductive layer 320 in a process for etching at least a portion of the first inorganic passivation layer-forming material 1510*s*. The first inorganic passivation layer 1510 may be deposited on the first opposite electrode 1230 without lifting.

Figure 16:
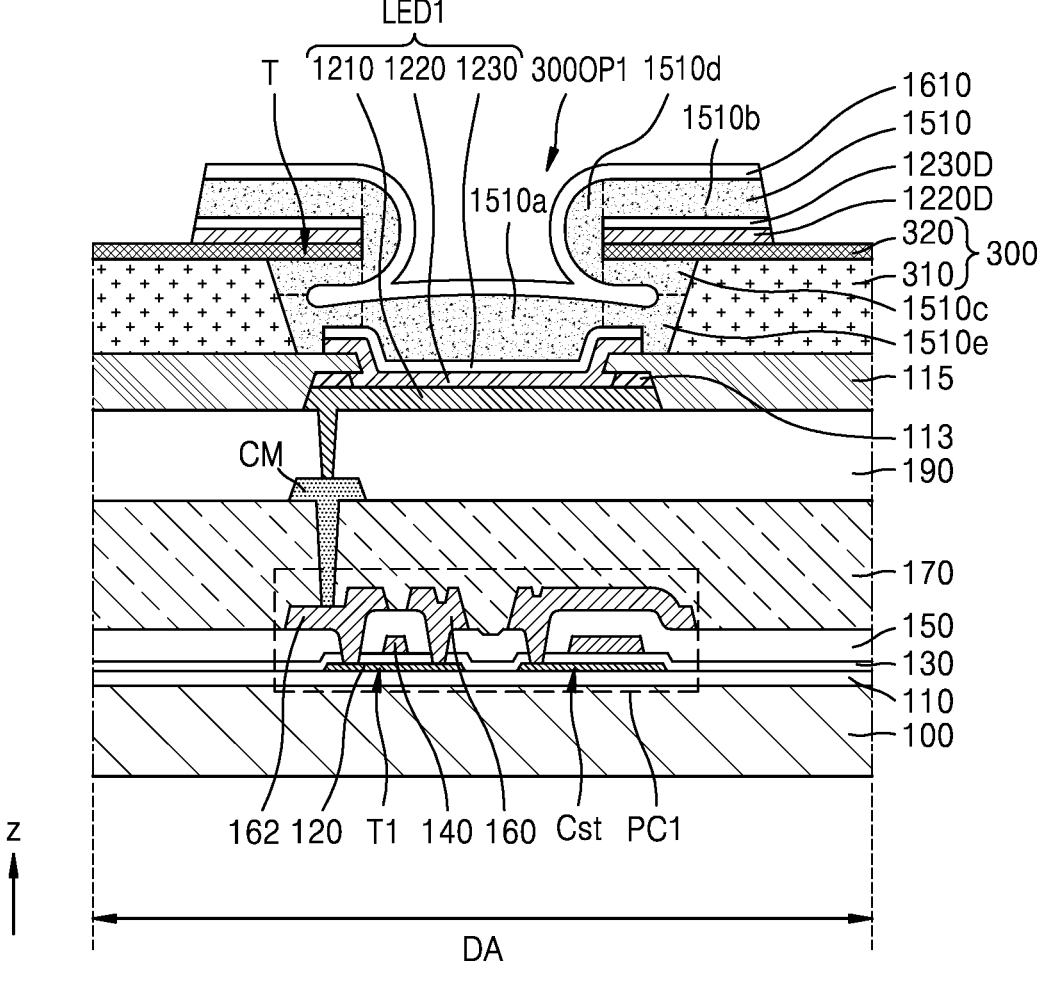
Figure 17:
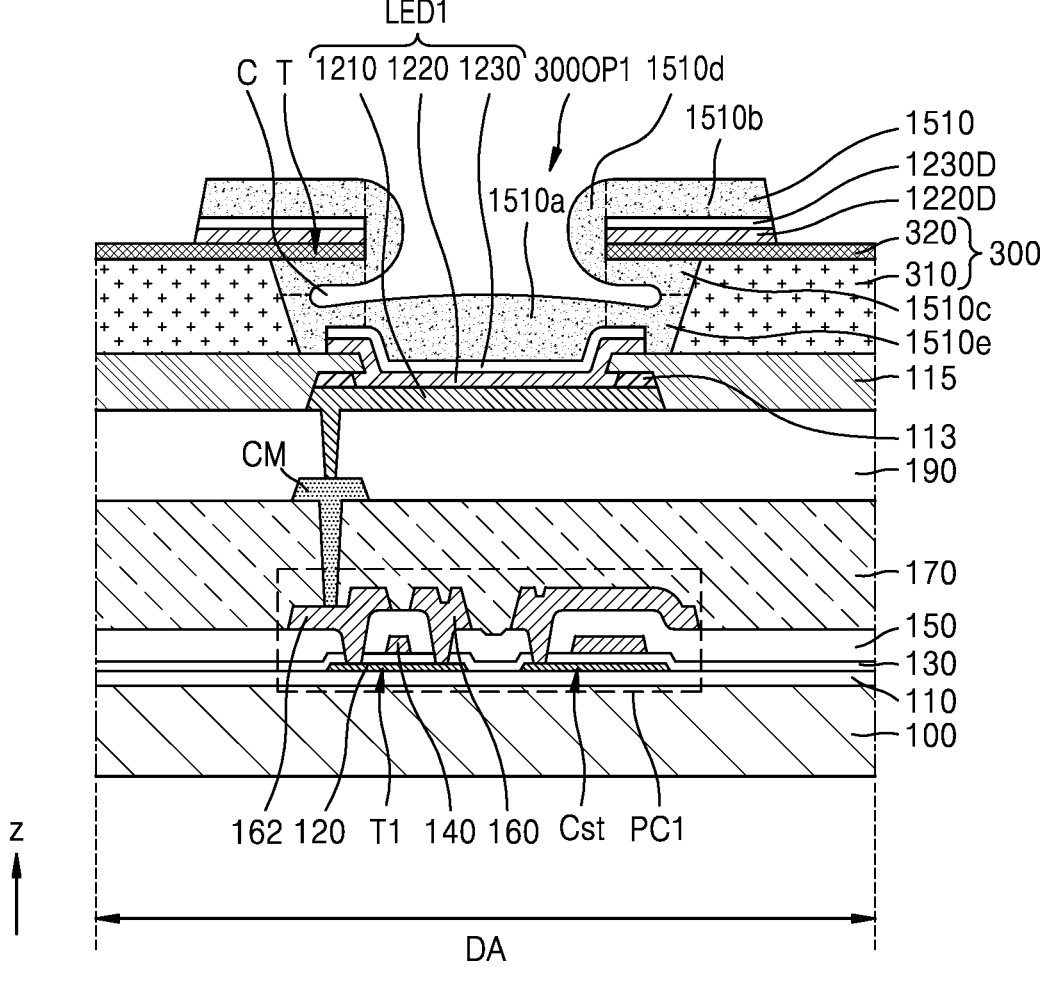

Referring to FIGS. 16 and 17, after the first inorganic passivation layer 1510 is formed by etching at least a portion of the first inorganic passivation layer-forming material of the first inorganic passivation layer-forming material 1510*s* by using the first metal layer 1610 and the second metal layer 1620 as masks, the first metal layer 1610 and the second metal layer 1620 may be removed. After the second metal layer 1620 disposed above the first metal layer 1610 is removed, the first metal layer 1610 may be removed. The first metal layer 1610 and the second metal layer 1620 may be removed via a wet etching process. Specifically, the second metal layer 1620 may be removed by the SC-02 solution, and the first metal layer 1610 may be removed by the TMAH solution. While the first metal layer 1610 and the second metal layer 1620 are removed via wet etching, the first conductive layer 310 and the second conductive layer 320 do not react to the solutions and thus may remain without being etched.

Figure 18:
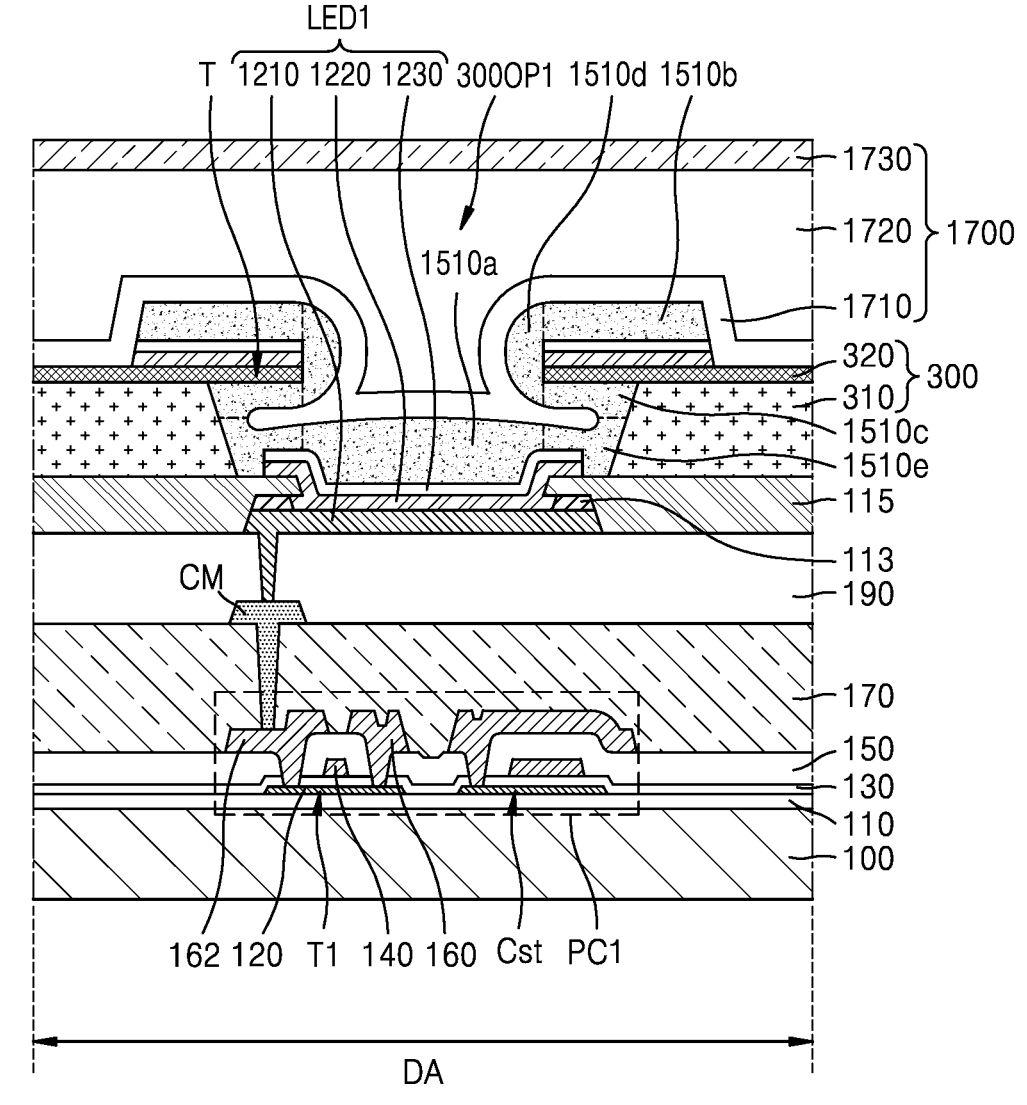

Referring to FIG. 18, an encapsulation layer 1700 may be continuously disposed on the first inorganic passivation layer 1510. The encapsulation layer 1700 may include a first inorganic encapsulation layer 1710, a second inorganic encapsulation layer 1730, and an organic encapsulation layer 1720 arranged between the first inorganic encapsulation layer 1710 and the second inorganic encapsulation layer 1730. The organic encapsulation layer 1720 may be continuously formed to be in contact with an upper surface of the first inorganic encapsulation layer 1710. In addition, the second inorganic encapsulation layer 1730 may be continuously formed to be in contact with an upper surface of the organic encapsulation layer 1720.

The first inorganic encapsulation layer 1710 and the second inorganic encapsulation layer 1730 may include at least one inorganic insulating material among aluminum oxide, titanium oxide, tantalum oxide, hafnium oxide, zinc oxide, silicon oxide, silicon nitride, and silicon oxynitride. The first inorganic encapsulation layer 1710, the second inorganic encapsulation layer 1730, and the first inorganic passivation layer 1510 may include the same material. However, the disclosure is not limited thereto.

The organic encapsulation layer 1720 may include a polymer-based material. The polymer-based material may include acrylic resin, epoxy-based resin, polyimide, and polyethylene. In an embodiment, the organic encapsulation layer 1720 may include acrylate.

Figure 19:
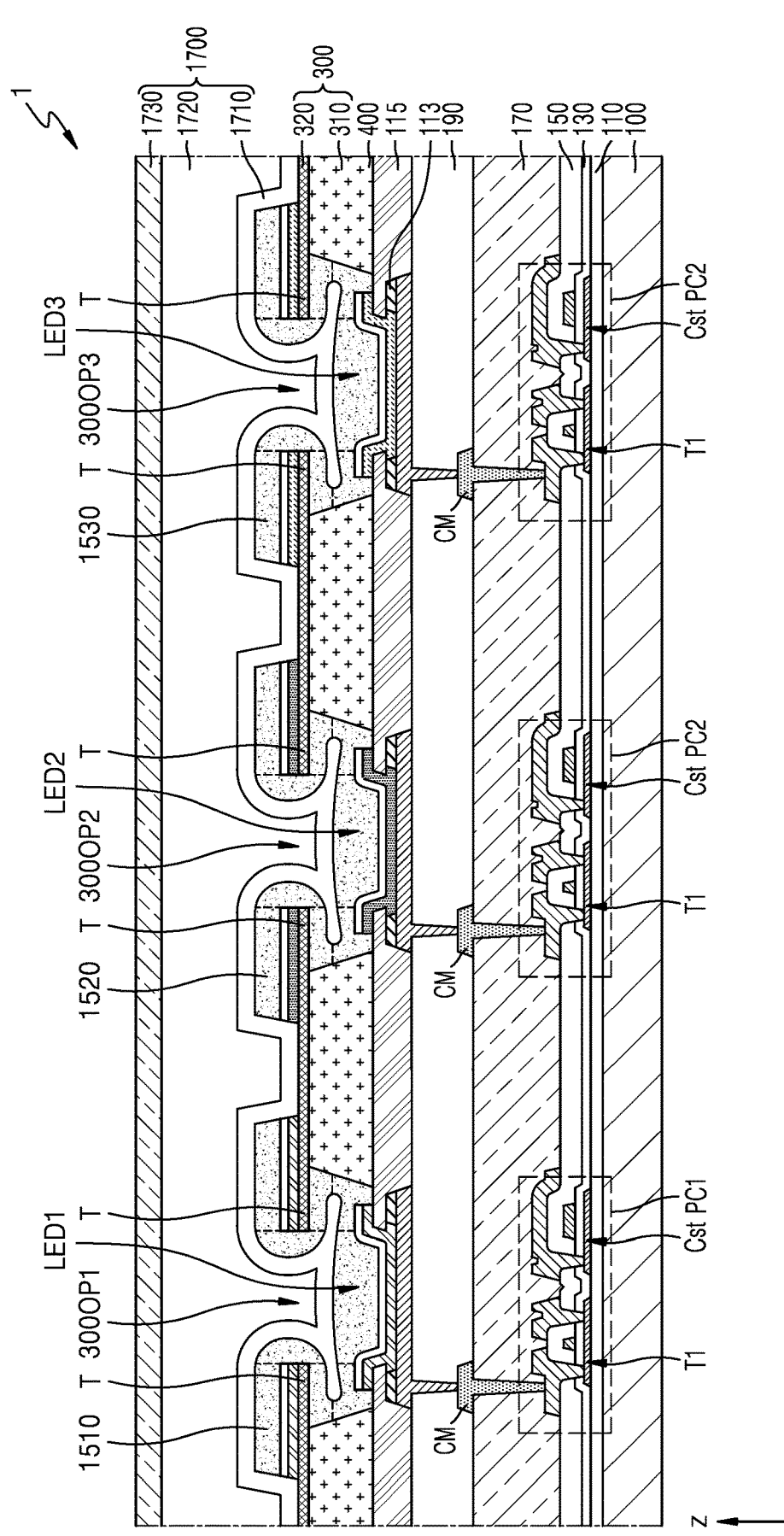
FIG. 19 is a cross-sectional view of a display apparatus according to an embodiment.

FIG. 19 is a cross-sectional view of a display apparatus according to an embodiment. Referring to FIG. 19, first to third light-emitting didoes LED1, LED2, and LED3 over the substrate 100 may be electrically connected to first to third subpixel circuits PC1, PC2, and PC3, respectively.

The first to third subpixel circuits PC1, PC2, and PC3 may have substantially the same structure. For example, the second and third subpixel circuits PC2 and PC3 may have the same structure as that of the first subpixel circuit PC1, and in this regard, FIG. 19 illustrates that each of the second and third subpixel circuits PC2 and PC3 includes the first transistor T1 and the storage capacitor Cst.

The first to third light-emitting diodes LED1, LED2, and LED3 may have substantially the same structure. As described above, the first light-emitting diode LED1 shown in FIG. 19 may include a structure of a stack of the first subpixel electrode 1210, the first intermediate layer 1220, and the first opposite electrode 1230, which are arranged in the first opening 300OP1 of the conductive bank layer 300.

The second light-emitting diode LED2 may include a structure of a stack of a second subpixel electrode, a second intermediate layer, and a second opposite electrode, which are arranged in a second opening 300OP2 of the conductive bank layer 300. The third light-emitting diode LED3 may include a structure of a stack of a third subpixel electrode, a third intermediate layer, and a third opposite electrode, which are arranged in a third opening 300OP3 of the conductive bank layer 300.

The second light-emitting diode LED2 and the third light-emitting diode LED3 may include substantially the same structure and material, except that an emission layer of the second intermediate layer and an emission layer of the third intermediate layer emit different colors of light compared to an emission layer of the first intermediate layer 1220 and include materials that emit different colors of light. Outer portions of the opposite electrodes, for example, the first to third opposite electrodes, of each of the first to third light-emitting diodes LED1, LED2, and LED3 may be in direct contact with a side surface of the first conductive layer 310, which faces first to third openings 300OP1, 300OP2, and 300OP3, as described above with reference to FIG. 3 and the like. In other words, the opposite electrodes of each of the first to third light-emitting didoes LED1, LED2, and LED3 that are physically separated or apart from each other may be electrically connected via contact with the conductive bank layer 300.

The first to third light-emitting didoes LED1, LED2, and LED3 may overlap first to third inorganic passivation layers 1510, 1520, and 1530, respectively, and/or may be covered by the first to third inorganic passivation layers 1510, 1520, and 1530, respectively. Inner portions of the first to third inorganic passivation layers 1510, 1520, and 1530 may overlap the first to third light-emitting didoes LED1, LED2, and LED3, respectively, and outer portions thereof may overlap upper portions of the tips T, respectively. FIG. 19 is a cross-sectional view and illustrates that the tip T of the conductive bank layer 300 is arranged at opposite sides of each of the first to third light-emitting didoes LED1, LED2, and LED3, but the tip T may have a shape surrounding each of the first to third light-emitting didoes LED1, LED2, and LED3 in a plan view (when viewed in a direction perpendicular to an upper surface of the substrate 100: z direction).

In an embodiment, the encapsulation layer 1700 on the first to third inorganic passivation layers 1510, 1520, and 1530 may be continuously formed on the substrate 100. The encapsulation layer 1700 may include the first inorganic encapsulation layer 1710, the second inorganic encapsulation layer 1730, and the organic encapsulation layer 1720 arranged between the first inorganic encapsulation layer 1710 and the second inorganic encapsulation layer 1730. The first inorganic encapsulation layer 1710 may be continuously formed to be in contact with upper surfaces of the first to third inorganic passivation layers 1510, 1520, and 1530. The organic encapsulation layer 1720 may be continuously formed on the first inorganic encapsulation layer 1710, and the second inorganic encapsulation layer 1730 may be continuously formed on the organic encapsulation layer 1720.

In the related art, in order to form the first inorganic passivation layer 1510 by etching at least a portion of the first inorganic passivation layer-forming material 1510s, a single mask including indium gallium zinc oxide (IGZO) may be disposed on a portion of the first inorganic passivation layer-forming material 1510s, which overlaps the first subpixel electrode 1210. Since the single mask including indium gallium zinc oxide (IGZO) may not cover an upper surface of the first inorganic passivation layer-forming material 1510s including the cavity C, there is a limitation in depositing the single mask including indium gallium zinc oxide (IGZO). Due to the limitation in depositing the single mask including indium gallium zinc oxide (IGZO), when a subsequent process is performed, moisture or oxygen may permeate through the side surface of the tip T of the second conductive layer 320, and lifting may occur between the first inorganic passivation layer 1510 and the first opposite electrode 1230.

In an embodiment, the first inorganic passivation layer-forming material 1510s may be efficiently sealed by arranging a double layer of an Aluminum (Al)-containing mask under an indium gallium zinc oxide (IGZO)-containing mask. The aluminum (Al)-containing mask may effectively cover a rounded surface of the first inorganic passivation layer-forming material 1510s arranged at the side surface of the tip T of the second conductive layer 320, and the upper surface of a portion of the first inorganic passivation layer-forming material 1510s disposed on the first opposite electrode 1230 and constituting a cavity C (See FIG. 17) disposed under the tip T of the second conductive layer 320. The first metal layer 1610 may efficiently seal the upper surface of the first inorganic passivation layer-forming material 1510s to prevent permeation of moisture or oxygen through the side surface of the tip T of the second conductive layer 320 in a process for etching at least a portion of the first inorganic passivation layer-forming material 1510s.

According to an embodiment, a method of manufacturing a display apparatus in which permeation of moisture and oxygen into a first inorganic encapsulation layer and an emission layer may be prevented may be implemented. However, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:

forming a subpixel electrode;

forming a conductive bank layer defining a first opening therein overlapping the subpixel electrode in a plan view, disposed over the subpixel electrode, and comprising a first conductive layer and a second conductive layer;

forming an insulating layer arranged between a peripheral portion of the subpixel electrode and the conductive bank layer and defining a second opening therein overlapping the first opening in the plan view;

forming an intermediate layer overlapping the subpixel electrode via the first opening of the conductive bank layer in the plan view;

forming an opposite electrode overlapping the subpixel electrode via the first opening of the conductive bank layer in the plan view;

continuously arranging an inorganic passivation layer-forming material on the opposite electrode and the conductive bank layer;

forming, on at least a portion of the inorganic passivation layer-forming material, a first metal layer and a second metal layer, which overlap the first opening of the conductive bank layer in the plan view; and forming an inorganic passivation layer by etching a portion of the inorganic passivation layer-forming material, which does not overlap the first metal layer and the second metal layer in the plan view, by using the first metal layer and the second metal layer as masks.

2. The method of claim 1, wherein the forming of the conductive bank layer comprises:

arranging, over the subpixel electrode, a first conductive layer-forming material and a second conductive layer-forming material;

arranging a first photoresist on at least a portion of the first conductive layer-forming material and the second conductive layer-forming material; and forming the first conductive layer and the second conductive layer, which defines the first opening therein, by etching portions of the first conductive layer-forming material and the second conductive layer-forming material, which do not overlap the first photoresist in the plan view.

3. The method of claim 2, wherein an etch rate of the first conductive layer-forming material is greater than an etch rate of the second conductive layer-forming material.

4. The method of claim 3, wherein the first conductive layer-forming material comprises a titanium (Ti)-copper (Cu) alloy.

5. The method of claim 3, wherein the second conductive layer-forming material comprises titanium (Ti).

6. The method of claim 1, wherein the second conductive layer of the conductive bank layer is disposed on an upper surface of the first conductive layer, and the second conductive layer comprises a tip protruding toward the first opening from an inner side surface of the first conducive layer.

7. The method of claim 6, wherein the inorganic passivation layer extends to cover an upper surface and a side surface of the conductive bank layer and an upper surface of the opposite electrode.

8. The method of claim 7, wherein the inorganic passivation layer comprises:

a first portion overlapping the second opening of the insulating layer in the plan view;

a second portion overlapping an upper surface of the tip of the second conductive layer in the plan view;

a third portion overlapping a bottom surface of the tip of the second conductive layer in the plan view; and a fourth portion between the second portion and the third portion.

9. The method of claim 8, wherein the fourth portion comprises a rounded surface in a cross-section.

10. The method of claim 9, wherein the inorganic passivation layer further comprises a fifth portion between the first portion and the third portion, and at least a portion of the fifth portion overlaps at least a portion of the second portion in the plan view.

11. The method of claim 10, wherein a cavity between the second portion and the fifth portion is further defined, and the cavity is disposed under the tip.

12. The method of claim 1, wherein the forming of the insulating layer arranged between the peripheral portion of the subpixel electrode and the conductive bank layer and defining the second opening therein overlapping the first opening in the plan view comprises:

arranging an insulating layer-forming material on the subpixel electrode; and forming the insulating layer, which defines the second opening therein overlapping the first opening in the plan view, by etching at least a portion of the insulating layer-forming material.

13. The method of claim 1, wherein the forming of, on the at least a portion of the inorganic passivation layer-forming material, the first metal layer and the second metal layer, which overlap the first opening of the conductive bank layer in the plan view comprises:

arranging a first metal layer-forming material on the inorganic passivation layer-forming material;

arranging a second metal layer-forming material on the first metal layer-forming material;

arranging, on at least a portion of the second metal layer-forming material, a second photoresist overlapping the first opening of the conductive bank layer in the plan view;

forming the second metal layer by etching a portion of the second metal layer-forming material, which does not overlap the second photoresist in the plan view; and forming the first metal layer by etching a portion of the first metal layer-forming material, which does not overlap the second photoresist in the plan view.

14. The method of claim 11, wherein the first metal layer continuously extends to be in contact with an upper surface of the inorganic passivation layer.

15. The method of claim 14, wherein the first metal layer continuously extends to be in contact with the rounded surface of the fourth portion of the inorganic passivation layer.

16. The method of claim 14, wherein the first metal layer continuously extends to be in contact with the upper surface of the inorganic passivation layer constituting the cavity disposed under the tip of the second conductive layer.

17. The method of claim 1, wherein the second metal layer is arranged to overlap an upper surface of the first metal layer in the plan view.

18. The method of claim 1, wherein the first metal layer comprises aluminum (Al).

19. The method of claim 1, wherein the second metal layer comprises indium gallium zinc oxide (IGZO).

20. The method of claim 1, wherein a thickness of the first metal layer is about 500 angstroms (Å) to about 1,000 Å, and a thickness of the second metal layer is about 1,000 Å to about 2,000 Å.

* * * * *